(12) United States Patent
Chen et al.

(10) Patent No.: US 8,163,640 B2
(45) Date of Patent: Apr. 24, 2012

(54) METAL GATE COMPATIBLE ELECTRICAL FUSE

(75) Inventors: Xiangdong Chen, Poughquag, NY (US);
Deok-kee Kim, Bedford Hills, NY (US);
Chandrasekharan Kothandaraman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 946 days.

(21) Appl. No.: 11/874,385

(22) Filed: Oct. 18, 2007

(65) Prior Publication Data
US 2009/0101989 A1 Apr. 23, 2009

(51) Int. Cl.
*H01L 27/06* (2006.01)
*H01L 21/3205* (2006.01)

(52) U.S. Cl. ............... 438/592; 257/379; 257/E21.294; 257/E27.014; 257/529; 257/329; 257/209; 257/210; 257/211; 438/132; 438/215

(58) Field of Classification Search .................. 257/377, 257/529, 329, 209–211; 438/592, 132, 215, 438/281, 333, 467
See application file for complete search history.

(56) References Cited

U.S. PATENT DOCUMENTS

| | | | |
|---|---|---|---|
| 7,067,359 B2 * | 6/2006 | Wu | 438/132 |
| 2006/0145296 A1 * | 7/2006 | Coolbaugh et al. | 257/536 |

* cited by examiner

*Primary Examiner* — David Vu
*Assistant Examiner* — Jonathan Han
(74) *Attorney, Agent, or Firm* — Scully, Scott, Murphy & Presser, P.C.; Joseph Petrokaitis, Esq.

(57) ABSTRACT

A dielectric material layer is formed on a metal gate layer for a metal gate electrode, and then lithographically patterned to form a dielectric material portion, followed by formation of a polycrystalline semiconductor layer thereupon. A semiconductor device employing a metal gate electrode is formed in a region of the semiconductor substrate containing a vertically abutting stack of the metal gate layer and the polycrystalline semiconductor layer. A material stack in the shape of an electrical fuse is formed in another region of the semiconductor substrate containing a vertical stack of the metal gate layer, the dielectric material portion, and the polycrystalline semiconductor layer. After metallization of the polycrystalline semiconductor layer, an electrical fuse containing a polycrystalline semiconductor portion and a metal semiconductor alloy portion is formed over the dielectric material portion that separates the electrical fuse from the metal gate layer.

20 Claims, 27 Drawing Sheets

METAL GATE COMPATIBLE ELECTRICAL FUSE

FIELD OF THE INVENTION

The present invention relates to semiconductor structures, and particularly to an electrical fuse compatible with another semiconductor structure having a metal gate electrode and methods of manufacturing the same.

BACKGROUND OF THE INVENTION

Electrical fuses (eFuses) are used in the semiconductor industry to implement array redundancy, field programmable arrays, analog component trimming circuits, and chip identification circuits. Once programmed, the programmed state of an electrical fuse does not revert to the original state on its own, that is, the programmed state of the fuse is not reversible. For this reason, electrical fuses are called One-Time-Programmable (OTP) memory elements.

The mechanism for programming an electrical fuse is electromigration of a metal semiconductor alloy induced by an applied electrical field and an elevated temperature on a portion of the electrical fuse structure. The metal semiconductor alloy is electromigrated under these conditions from the portion of the electrical fuse structure, thereby increasing the resistance of the electrical fuse structure. The rate and extent of electromigration during programming of an electrical fuse is dependent on the temperature and the current density at the electromigrated portion.

An electrical fuse typically comprises an anode, a cathode, and a fuselink. The fuselink is a narrow strip of a conductive material adjoining the anode and cathode. During programming of the electrical fuse, a positive voltage bias is applied to the anode and a negative voltage bias is applied to the cathode. As electrical current flows through the fuselink having a narrow cross-sectional area, the temperature of the fuselink is elevated. A high current density combined with the elevated temperature at the fuselink facilitates electromigration of the conductive material, which may comprise a metal silicide.

A typical prior art electrical fuse employs a stack of a gate dielectric, a polysilicon layer, and a metal silicide layer. Under electrical bias through the electrical fuse, the metal silicide layer provides an initial current path since a typical metal silicide material has a conductivity at least one order of magnitude greater than the conductivity of even the most heavily doped polysilicon material. As the metal silicide material electromigrates, the electrical current path formed by the initial metal silicide layer is broken. Further, the high temperature that the metal silicide layer generated prior to completion of electromigration contributes to dopant electromigration in the polysilicon layer underneath, causing depletion of the dopants in the polysilicon layer in a programmed prior art electrical fuse. A programmed electrical fuse attains a high enough resistance so that a sensing circuit may detect the programmed electrical fuse as such. Thus, the prior art electrical fuse containing a vertically abutting stack of the gate dielectric, the polysilicon layer, and the metal silicide layer provides an OTP memory element without introducing any additional mask level or any extra processing steps.

However, continuous advances in the semiconductor technology oftentimes require changes in the material employed in semiconductor structures. Of particular relevance is the advent of a metal gate electrode, which, in addition to the gate dielectric, a polysilicon layer, and a metal silicide layer, contains a metal gate layer in a gate stack. Typically, the metal gate layer is employed in conjunction with a high-k gate dielectric material. This is because high gate leakage current of nitrided silicon dioxide and depletion effect of polysilicon gate electrodes limits the performance of conventional silicon oxide based gate electrodes. High performance devices for an equivalent oxide thickness (EOT) less than 1 nm require a high-k gate dielectric material and a metal gate electrode to limit the gate leakage current and provide high on-currents.

The high-k gate dielectric materials refer to dielectric metal oxides or dielectric metal silicates having a dielectric constant that is greater than the dielectric constant of silicon oxide of 3.9 and capable of withstanding relatively high temperatures, e.g., above 600° C., and preferably above 800° C. The metal gate layer may comprise a metal, a metal alloy, or a metal nitride, and typically has an even higher conductivity than the metal silicide.

The presence of the metal gate layer in the metal gate electrode make programming of an electrical fuse containing the metal gate layer extremely difficult. This is because a properly programmed electrical fuse must not contain a high conductivity current path to insure that the resistance of the programmed electrical fuse is sufficiently high. Thus, the introduction of metal gate electrodes into semiconductor devices has a disadvantage side effect of introducing a metal gate structure into an electrical fuse, and making proper programming of the electrical fuse difficult due to the presence of the metal gate layer in the electrical fuse. Degradation of electrical fuse programming characteristics has been confirmed in electrical fuses having a metal gate structure during the course of the research leading to the present invention.

In view of the above, there exists a need for an electrical fuse structure accommodating fabrication of other semiconductor devices employing metal gate electrodes, yet providing good programming characteristics including high post-programming resistance, and methods of manufacturing the same.

SUMMARY OF THE INVENTION

The present invention addresses the needs described above by providing an electrical fuse containing only a polycrystalline semiconductor portion and a metal semiconductor alloy portion, while not containing a metal portion of a gate stack, and methods of manufacturing the same.

In the present invention, a stack of a gate dielectric layer and a metal gate layer is formed on a semiconductor substrate. A dielectric material layer is formed on the metal gate layer, and then lithographically patterned over an area of shallow trench isolation in the semiconductor substrate to form a dielectric material portion. A polycrystalline semiconductor layer is formed directly on the exposed portion of the metal gate layer and the dielectric material portion. A semiconductor device employing a metal gate electrode is formed in a region of the semiconductor substrate containing a vertically abutting stack of the metal gate layer and the polycrystalline semiconductor layer. A material stack in the shape of an electrical fuse is formed in another region of the semiconductor substrate containing a vertical stack of the metal gate layer, the dielectric material portion, and the polycrystalline semiconductor layer. After metallization of the polycrystalline semiconductor layer, an electrical fuse containing a polycrystalline semiconductor portion and a metal semiconductor alloy portion is formed over the dielectric material portion that separates the electrical fuse from the metal gate layer. The electrical fuse is thermally and electrically isolated from a metal gate layer by the dielectric material layer.

According to an aspect of the present invention, a semiconductor structure is provided, which comprises a first structure located in a first region of a semiconductor substrate and a second structure located in a second region of the semiconductor substrate, wherein the first structure comprises:

a first gate dielectric portion abutting the semiconductor substrate;

a first metal gate portion abutting the first gate dielectric portion;

a dielectric material portion abutting the first metal gate portion; and an electrical fuse including a first polycrystalline semiconductor portion abutting the dielectric material portion and a first metal semiconductor alloy portion abutting the first polycrystalline semiconductor portion; and wherein the second structure comprises:

a second gate dielectric portion abutting the semiconductor substrate;

a second metal gate portion abutting the second gate dielectric portion;

a second polycrystalline semiconductor portion abutting the second metal gate portion; and a second metal semiconductor alloy portion abutting the second polycrystalline semiconductor portion.

According to another aspect of the present invention, a method of forming a semiconductor structure is provided, which comprises:

forming a gate dielectric layer on a semiconductor substrate;

forming a metal gate layer on the gate dielectric layer;

forming a dielectric material portion in a first region, while the dielectric material portion is not present in a second region;

forming a polycrystalline semiconductor layer on the metal gate layer and on the dielectric material portion;

patterning a first structure containing a first portion of the polycrystalline semiconductor layer, at least a fraction of the dielectric material portion, a first portion of the metal gate layer, and a first portion of the gate dielectric layer; and patterning a second structure containing a second portion of the polycrystalline semiconductor layer, a second portion of the metal gate layer, and a second portion of the gate dielectric layer, and not containing any fraction of the dielectric material portion.

DETAILED DESCRIPTION OF THE INVENTION

Figure 1A:
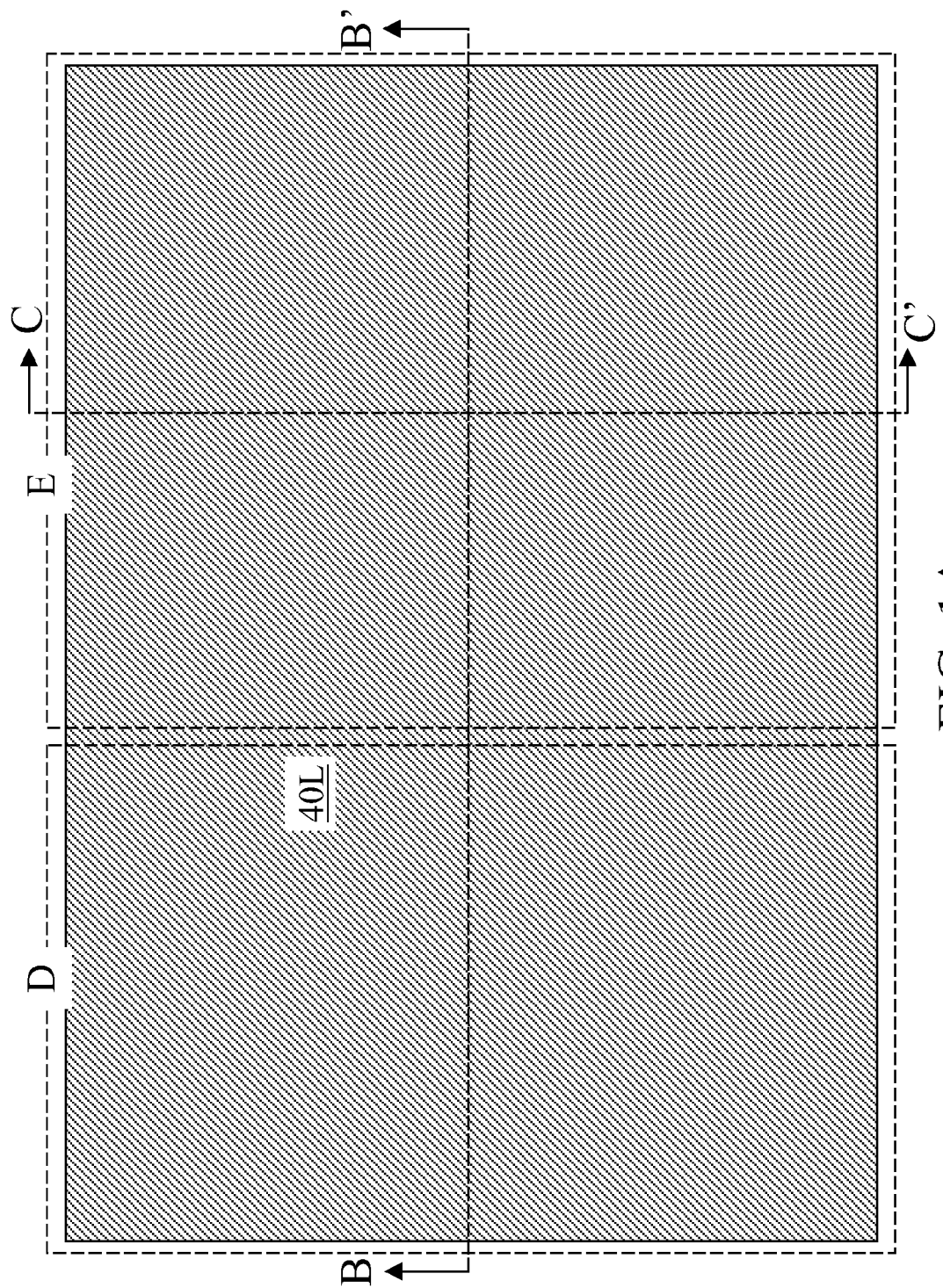
FIGS. 1A-6C are sequential views of a first exemplary structure according to a first embodiment of the present invention. Figures with the same numeric label correspond to the same stage of manufacturing; figures with the suffix "A" are top-down views; figures with the suffix "B" or "C" are vertical cross-sectional views along the plane B-B' or the plan C-C', respectively, of the corresponding figure with the same numeric label and the suffix "A."

As stated above, the present invention relates to an electrical fuse compatible with another semiconductor structure having a metal gate electrode and methods of manufacturing the same, which is now described in detail with accompanying figures. It is noted that like and corresponding elements mentioned herein and illustrated in the drawings are referred to by like reference numerals.

Figure 1B:
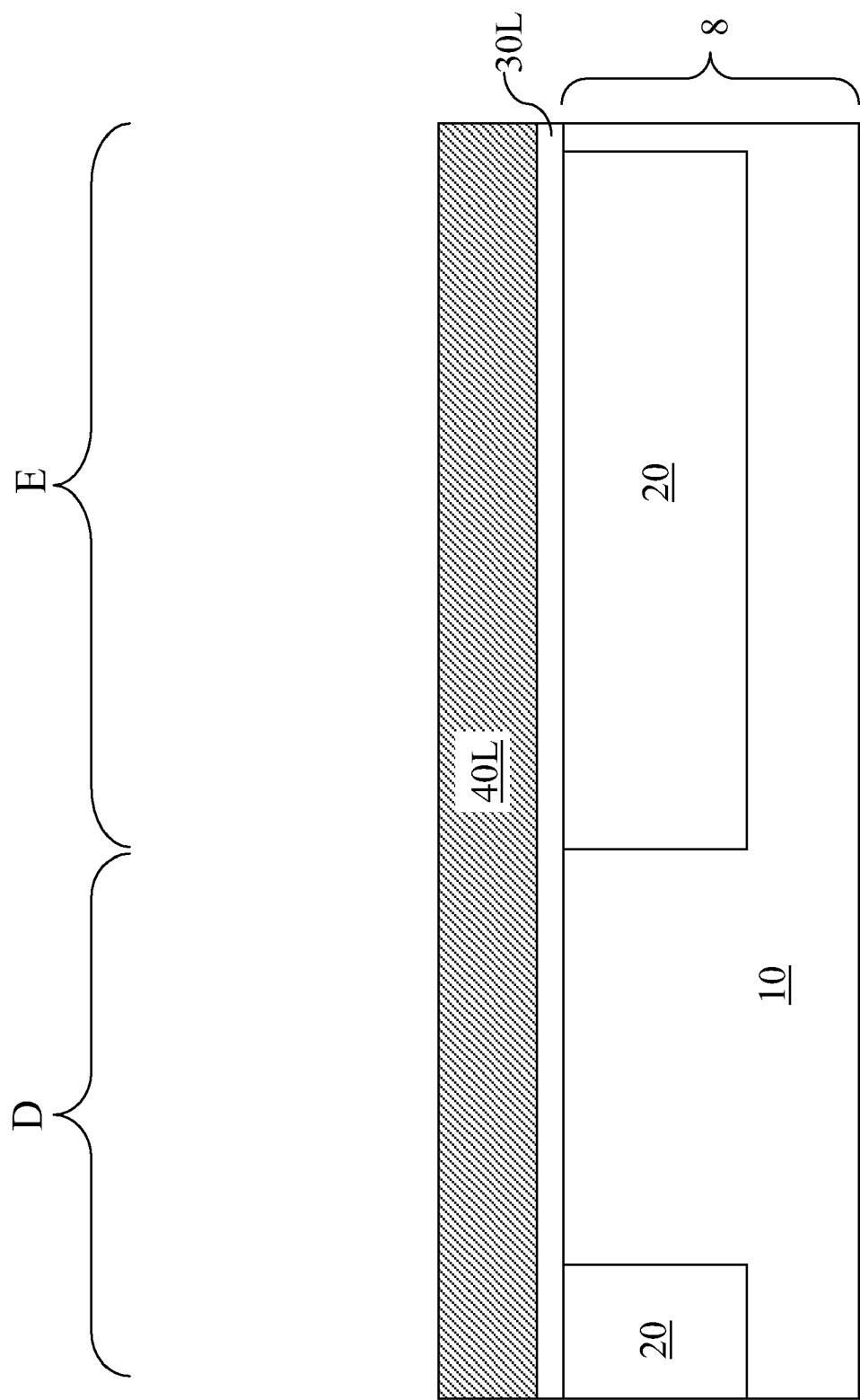
Figure 1C:
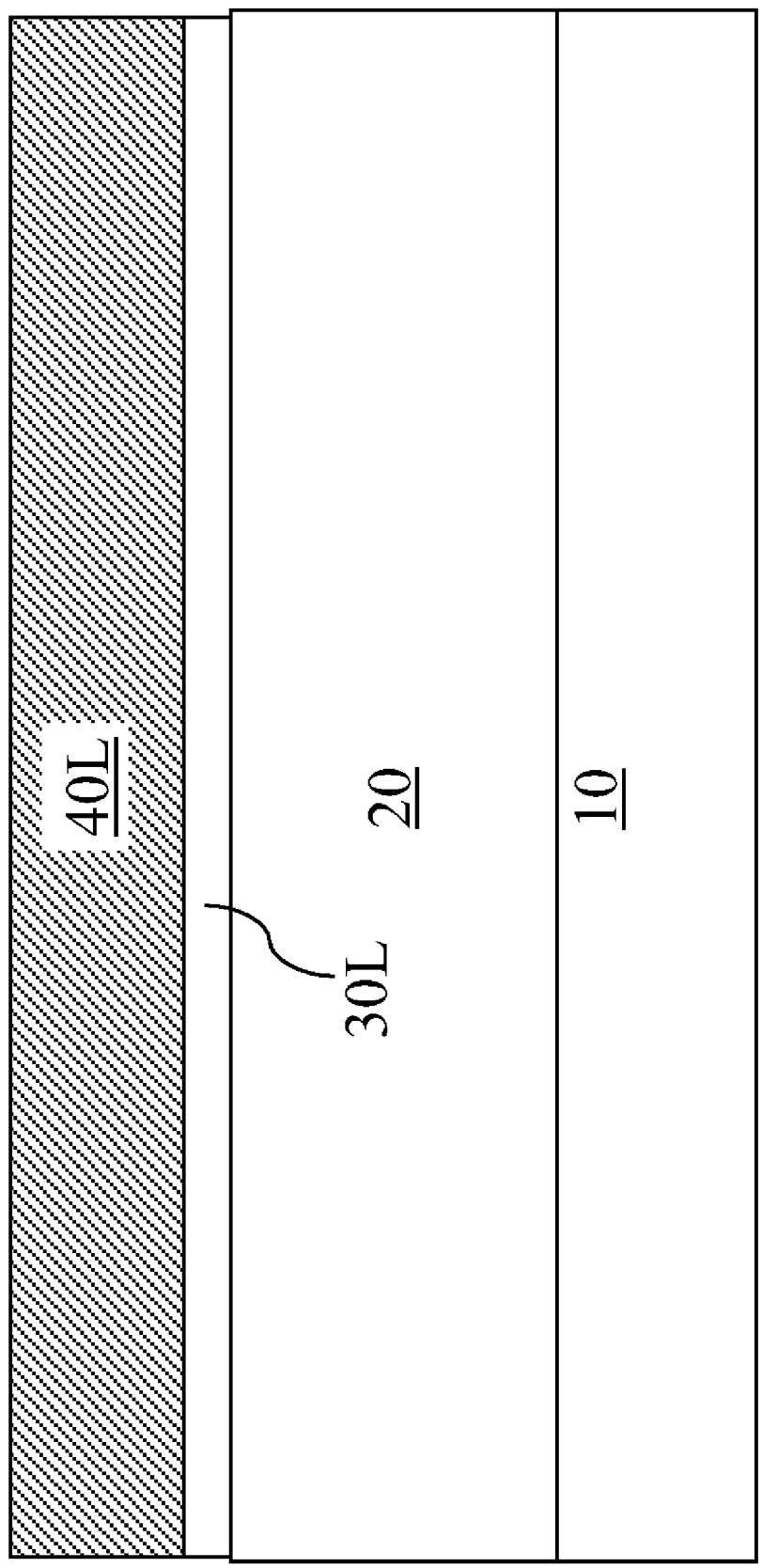

Referring to FIGS. 1A-1C, a first exemplary semiconductor structure according to the present invention is shown. FIG. 1A is a top-down view. FIG. 1B is a vertical cross-sectional view along the plane B-B' shown in FIG. 1A. FIG. 1C is a vertical cross-sectional view along the plane C-C' shown in FIG. 1A.

The first exemplary semiconductor structure comprises a semiconductor substrate 8 that contains a semiconductor layer 10 and a shallow trench isolation structure 20. The semiconductor substrate may be a bulk substrate, a semiconductor-on-insulator (SOI) substrate, or a hybrid substrate having a bulk portion and an SOI portion. The semiconductor layer 10 comprises a semiconductor material such as silicon, a silicon containing alloy, a germanium containing alloy, a III-V compound semiconductor, or a II-IV semiconductor. Preferably, the semiconductor layer 10 is single crystalline. The shallow trench isolation structure 20 comprises a dielectric material and provides electrical isolation between semiconductor devices formed on the semiconductor layer 10.

A stack of a gate dielectric layer 30L and a metal gate layer 40L are formed on a top surface of the semiconductor substrate 8. The gate dielectric layer 30L comprises a high-k dielectric material, which comprises a dielectric metal oxide having a dielectric constant that is greater than the dielectric constant of silicon oxide of 3.9. The dielectric metal oxide is a high-k material including a metal and oxygen, and optionally nitrogen. For example, the high-k dielectric material may comprise $HfO_2$, $ZrO_2$, $La_2O_3$, $Al_2O_3$, $TiO_2$, $SrTiO_3$, $LaAlO_3$, $Y_2O_3$, an alloy thereof, or a silicate thereof. The gate dielectric layer 30L is formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc. The thickness of the gate dielectric layer 30L may be from about 2 nm to about 6 nm, and may have an effective oxide thickness on the order of or less than 1 nm.

The metal gate layer 40L is formed directly on the gate dielectric layer 30L, for example, by chemical vapor deposition (CVD), physical vapor deposition (PVD), atomic layer deposition (ALD), etc. The metal gate layer 40L comprises a conductive metallic material, which may be a metal, a metal alloy, or a metal nitride. For example, the metal gate layer 40L may comprise a material such as TaN, TiN, WN, TiAlN, TaCN, other conductive refractory metal nitrides, or an alloy thereof The thickness of, the metal gate layer 40L may be from about 5 nm to about 40 nm, and preferably from about 7 nm to about 20 nm, although lesser and greater thicknesses are also contemplated herein. The composition of the metal gate layer 40L may be selected to optimize performance of semiconductor devices such as a threshold voltage of a transistor employing a metal gate.

The area of the first exemplary semiconductor structure, as seen in a top-down view of FIG. 1, comprises two non-overlapping regions. A device region D contains at least a portion of the semiconductor layer 10 that vertically abuts the gate dielectric layer 30L. An electrical fuse region E contains at least a portion of the shallow trench isolation structure 20 that vertically abuts the gate dielectric layer 30L. The device region D may, or may not, laterally abut the electrical fuse region E.

Figure 2A:
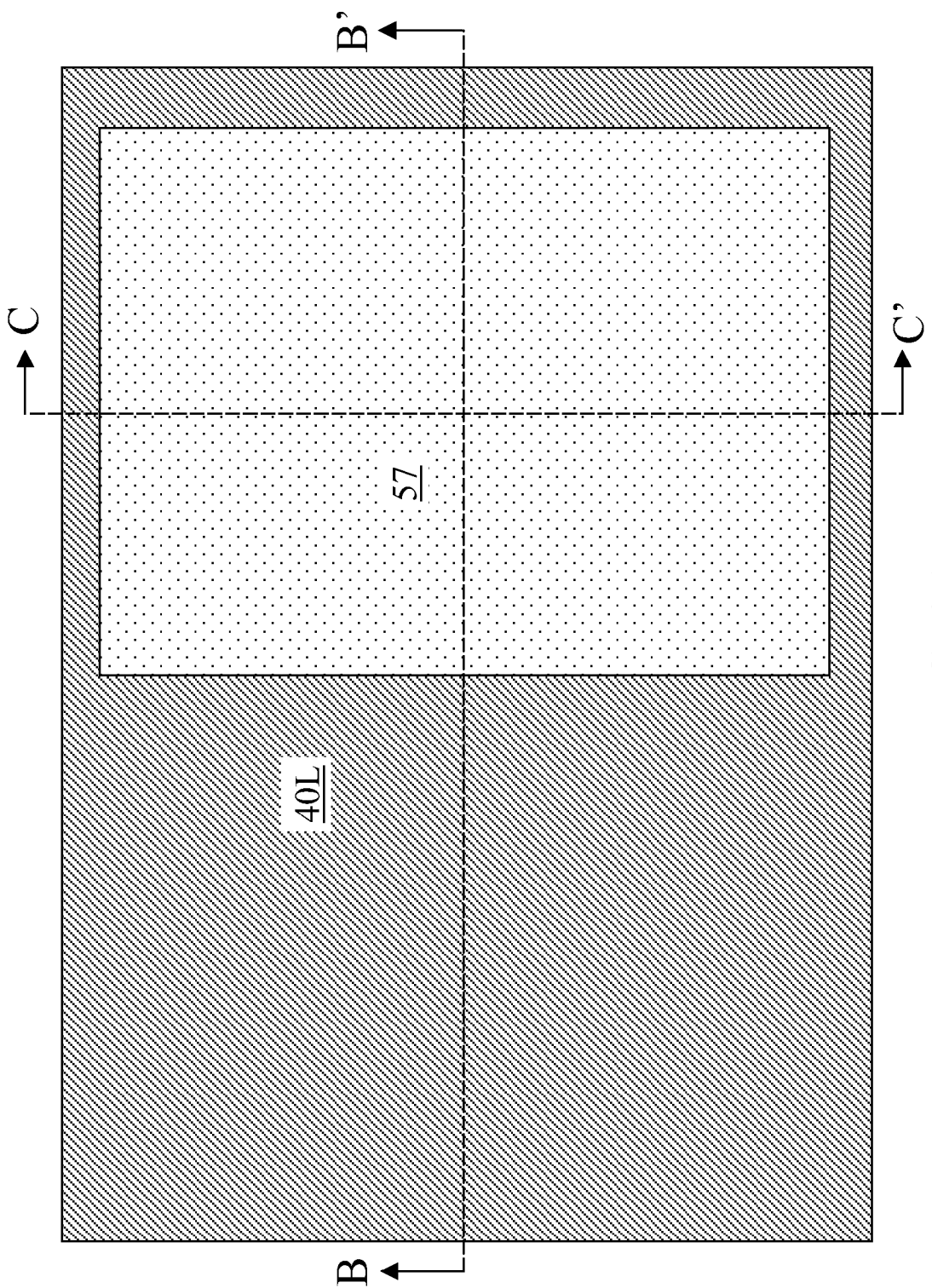
Figure 2B:
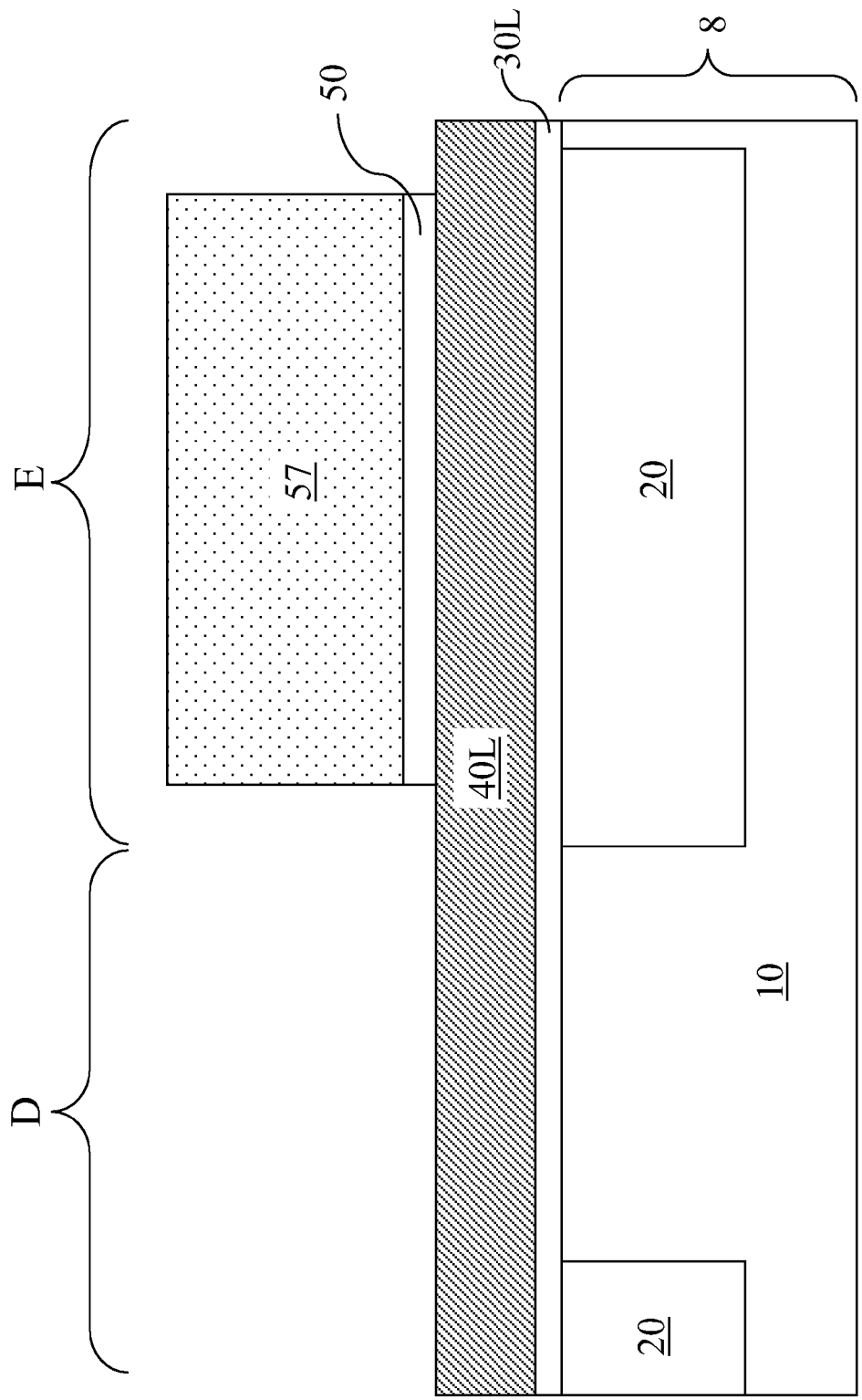
Figure 2C:
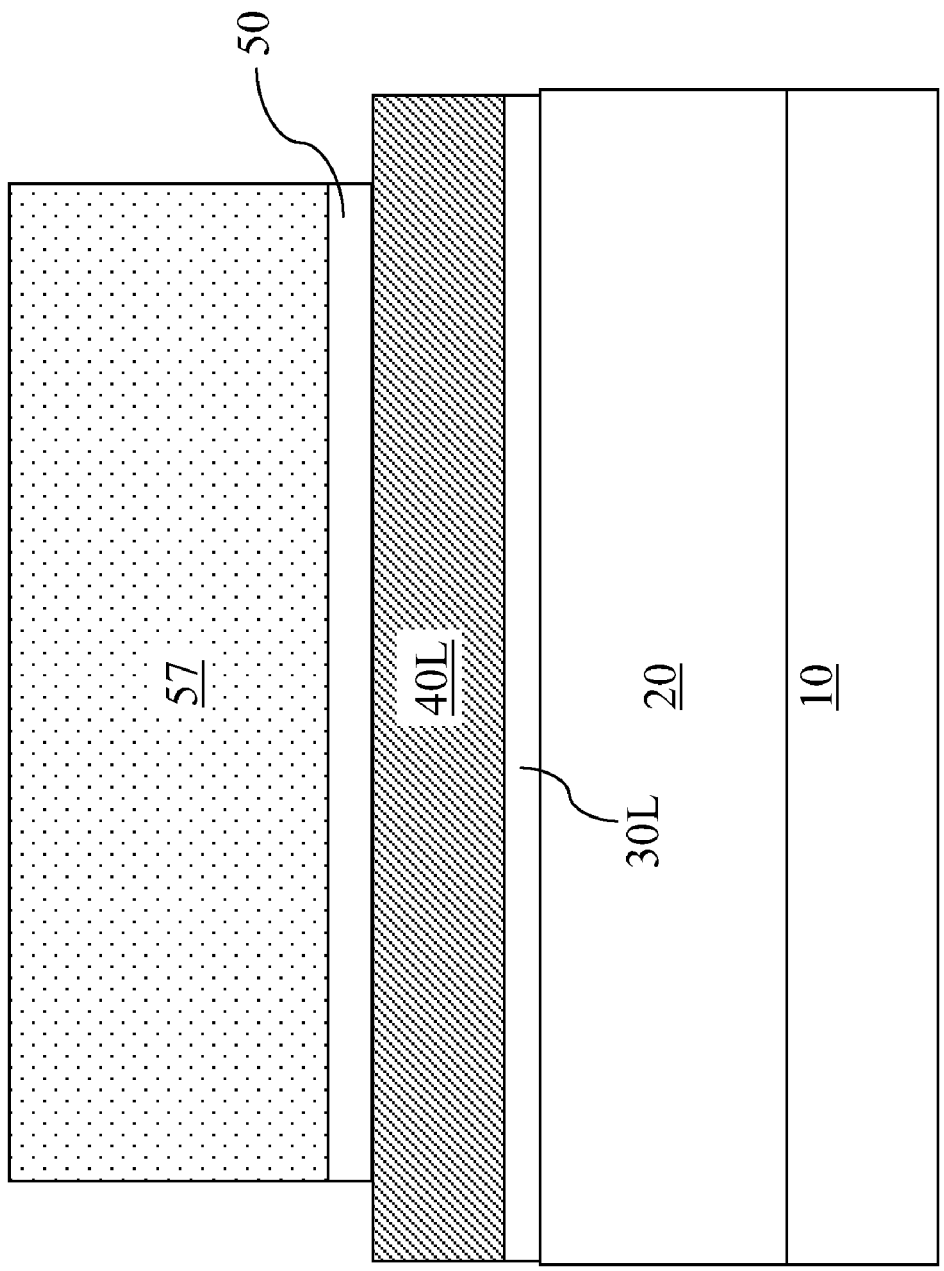

Referring to FIGS. 2A-2C, a dielectric material portion 50 is formed in the electrical fuse region E. Formation of the electrical fuse region E may be effected by first forming a dielectric material layer on the metal gate layer 40L, followed by application and patterning of a block level photoresist 57 and an anisotropic etch, such as a reactive ion etch, employing the remaining portion of the block level photoresist 57 as an etch mask.

The dielectric material layer comprises the same material as the dielectric material portion 50 that is subsequently formed therefrom. The dielectric material portion 50 may comprise any dielectric material that provides electrical and thermal isolation. For example, the dielectric material portion 50 may comprise silicon oxide, silicon nitride, or silicon oxynitride. The thickness of the dielectric material portion may be from about 5 nm to about 100 nm, and preferably from about 10 nm to about 30 nm, although lesser and greater thicknesses are also explicitly contemplated herein. Preferably, the anisotropic etch is selective to the metal gate layer 40L. The dielectric material portion 50 is present in the electrical fuse region E, and is absent in the device region D.

Figure 3A:
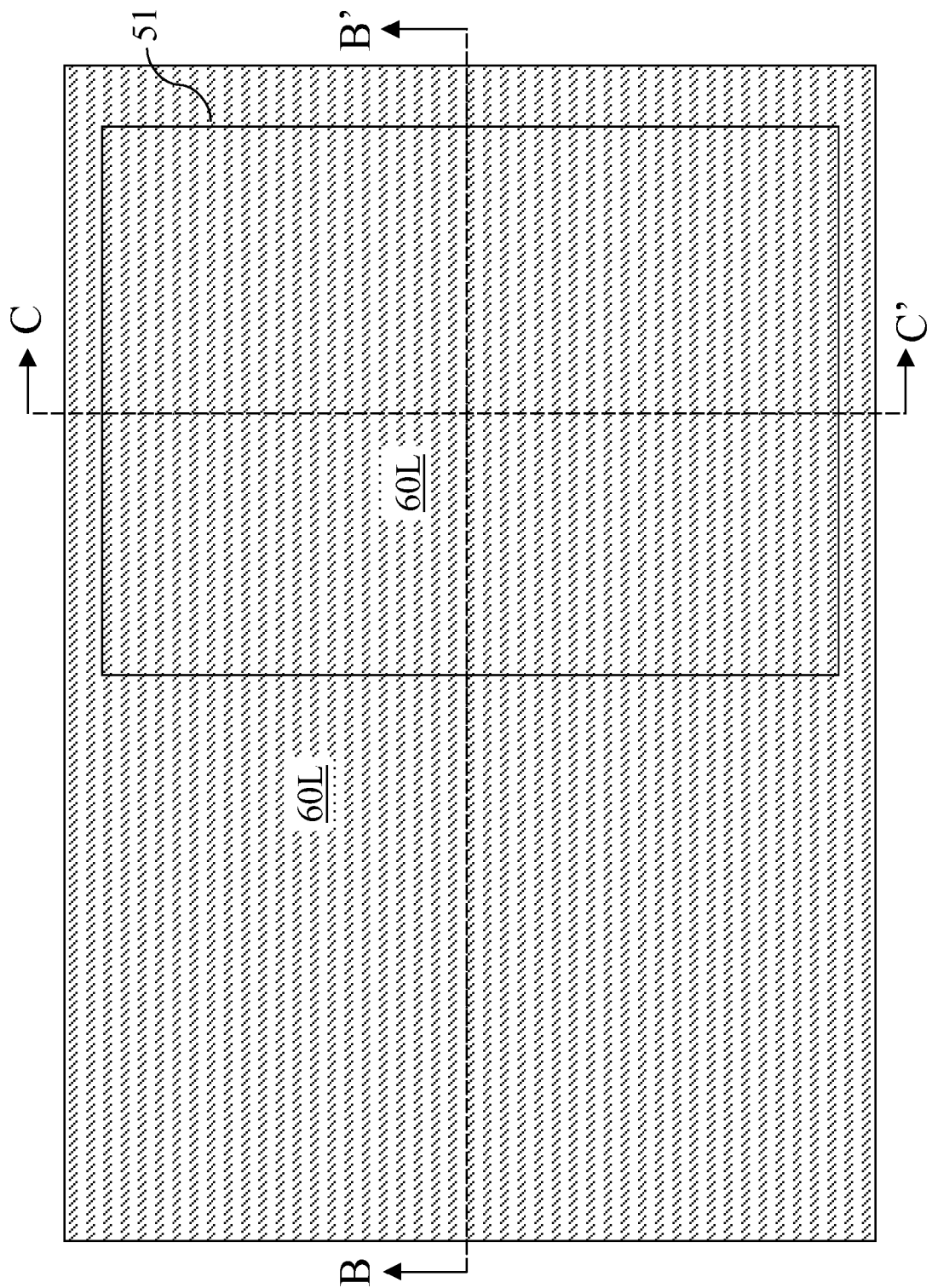
Figure 3B:
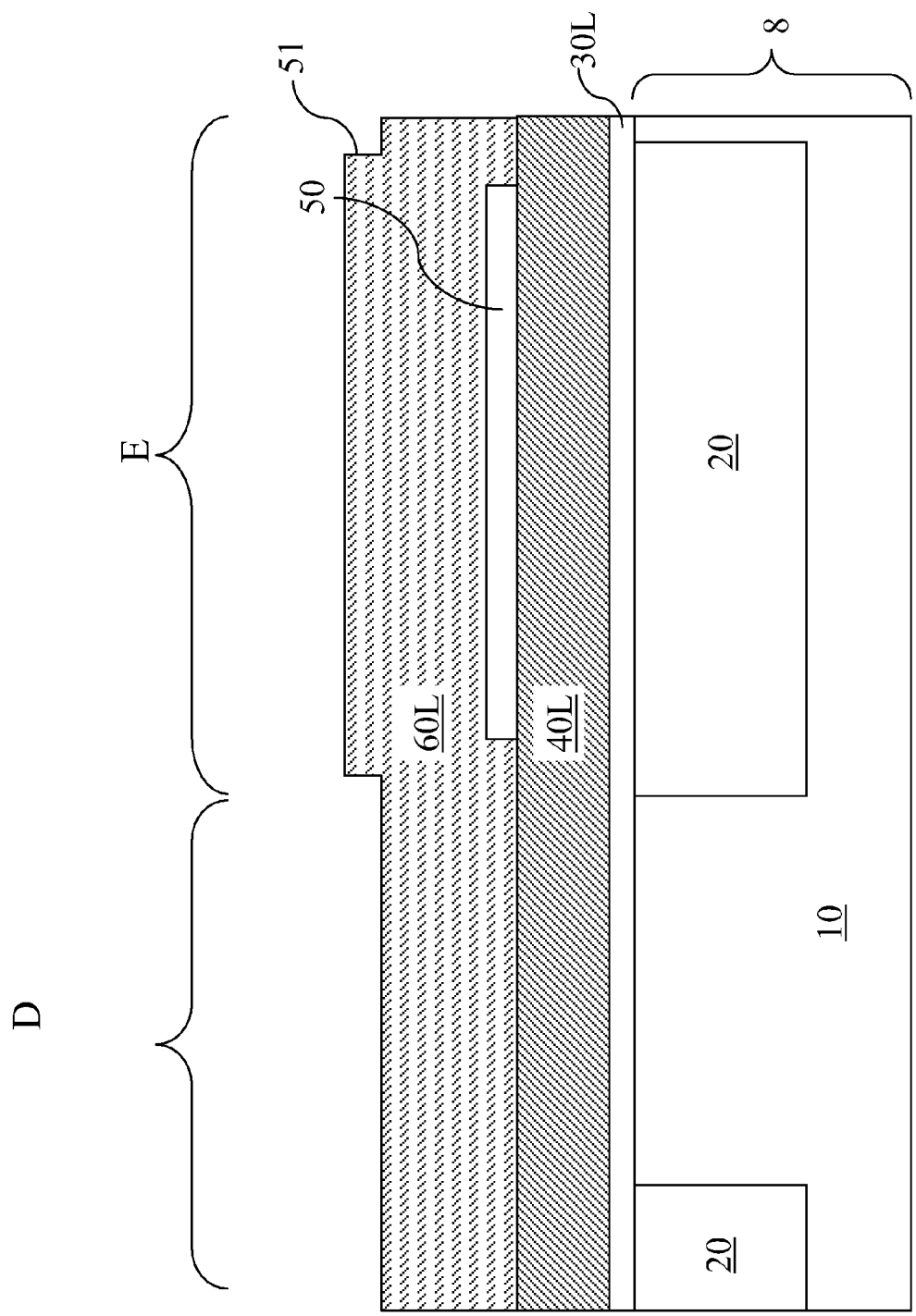
Figure 3C:
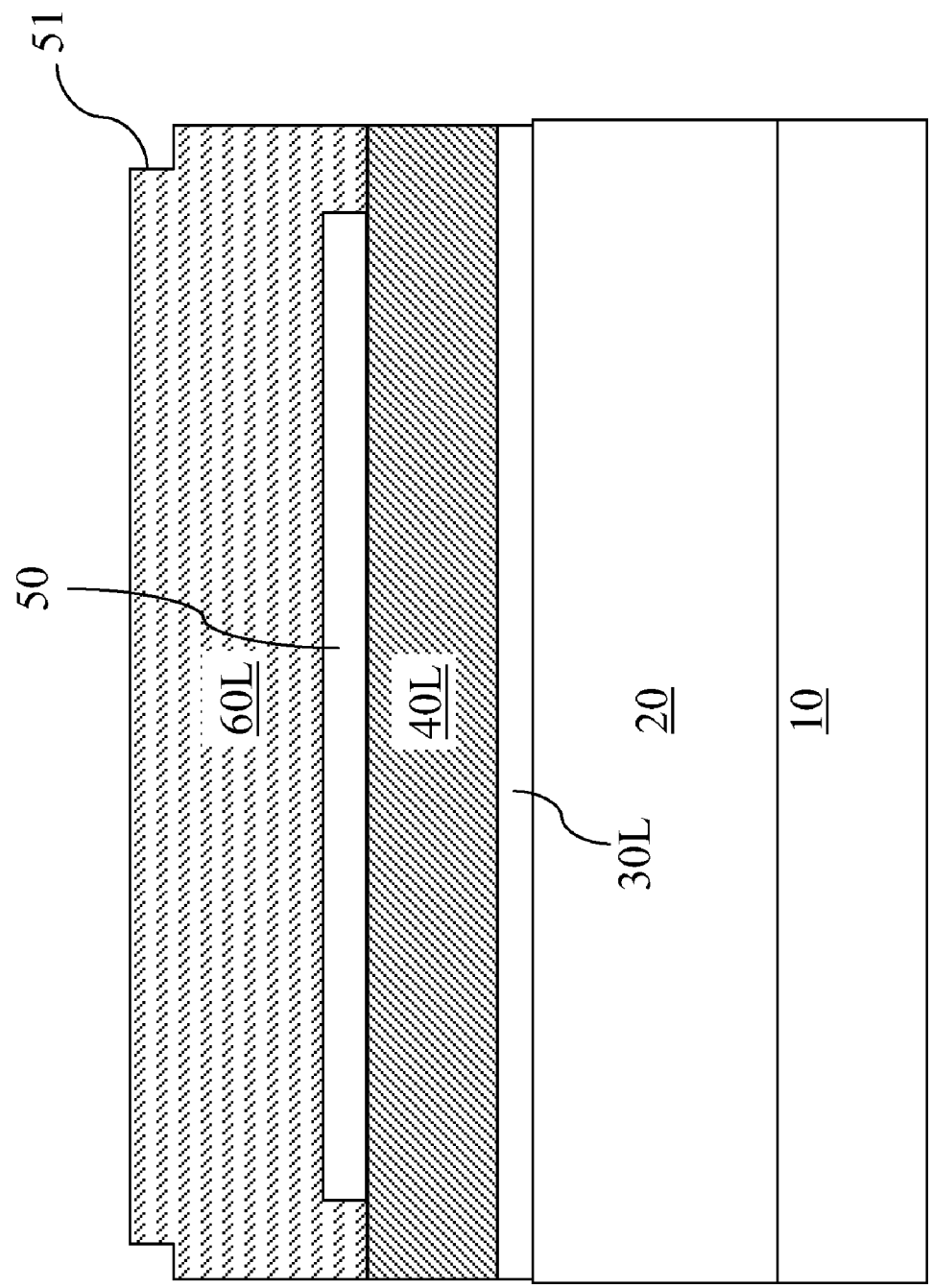

Referring to FIGS. 3A-3C, a polycrystalline semiconductor layer 60L is formed on the exposed portion of the metal gate layer 40L and a top surface of the dielectric material portion 50. The polycrystalline semiconductor layer 60L has a polycrystalline, microcrystalline, or amorphous structure and comprises a semiconductor material such as silicon, a silicon containing alloy, a germanium containing alloy, a III-V compound semiconductor, or a II-IV semiconductor. Preferably, polycrystalline semiconductor layer 60L is doped with at least one electrical dopant such as boron, gallium, indium, phosphorus, arsenic, antimony, or a combination thereof. The polycrystalline semiconductor layer 60L may be formed by chemical vapor deposition (CVD) such as rapid thermal chemical vapor deposition (RTCVD), low pressure chemical vapor deposition (LPCVD), plasma enhanced chemical vapor deposition (PECVD). The polycrystalline semiconductor layer 60L may have a thickness from about 30 nm to about 300 nm, and preferably from about 50 nm to about 200 nm, and even more preferably from about 80 nm to about 150 nm.

In case a conformal deposition process is employed for formation of the polycrystalline semiconductor layer 60L, a step 51 having a flat top surface may be formed in the polycrystalline semiconductor layer 60L replicating a contour of the dielectric material portion with a lateral outward offset of about the thickness of the dielectric material portion 50.

Figure 4A:
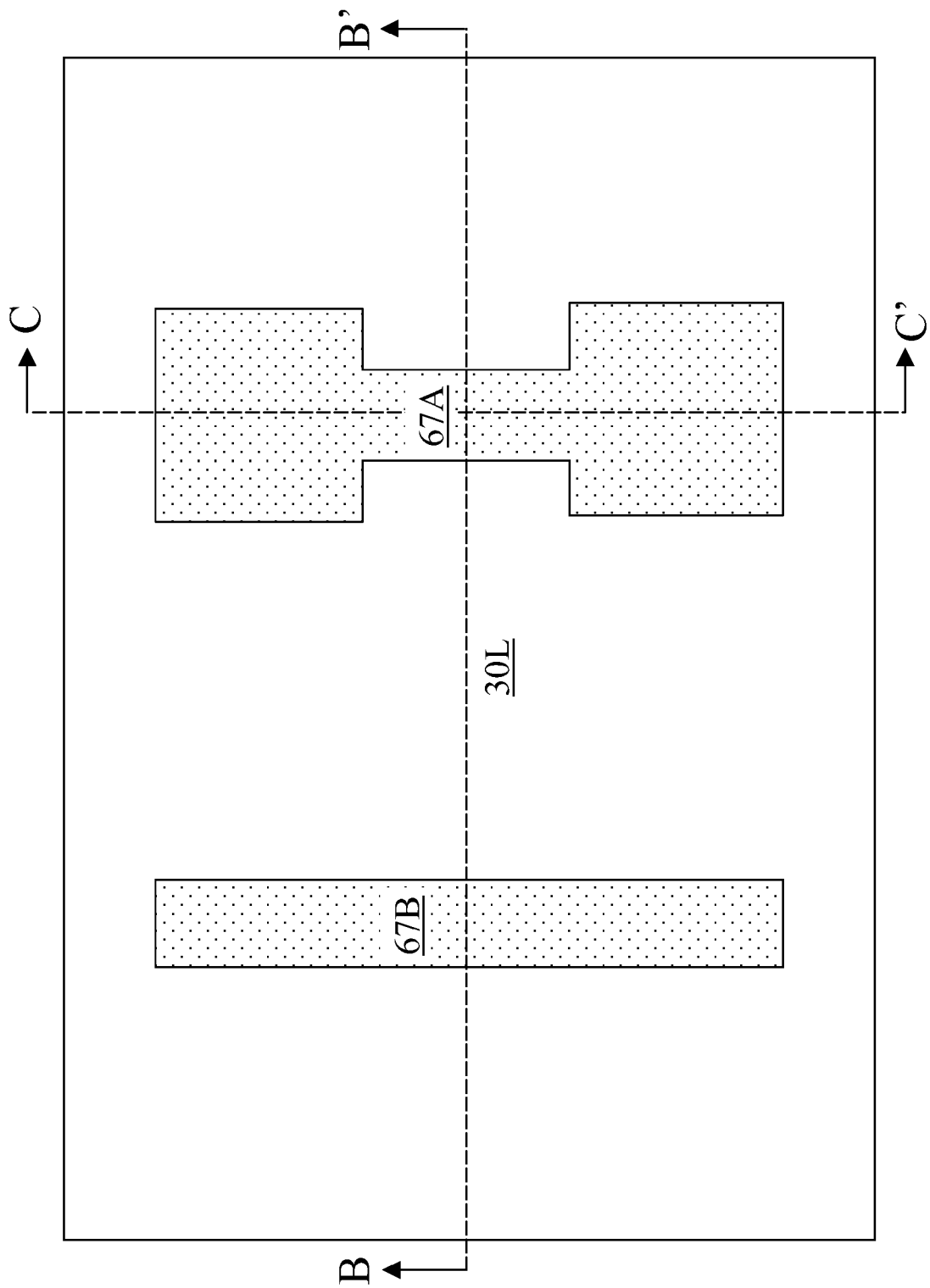
Figure 4B:
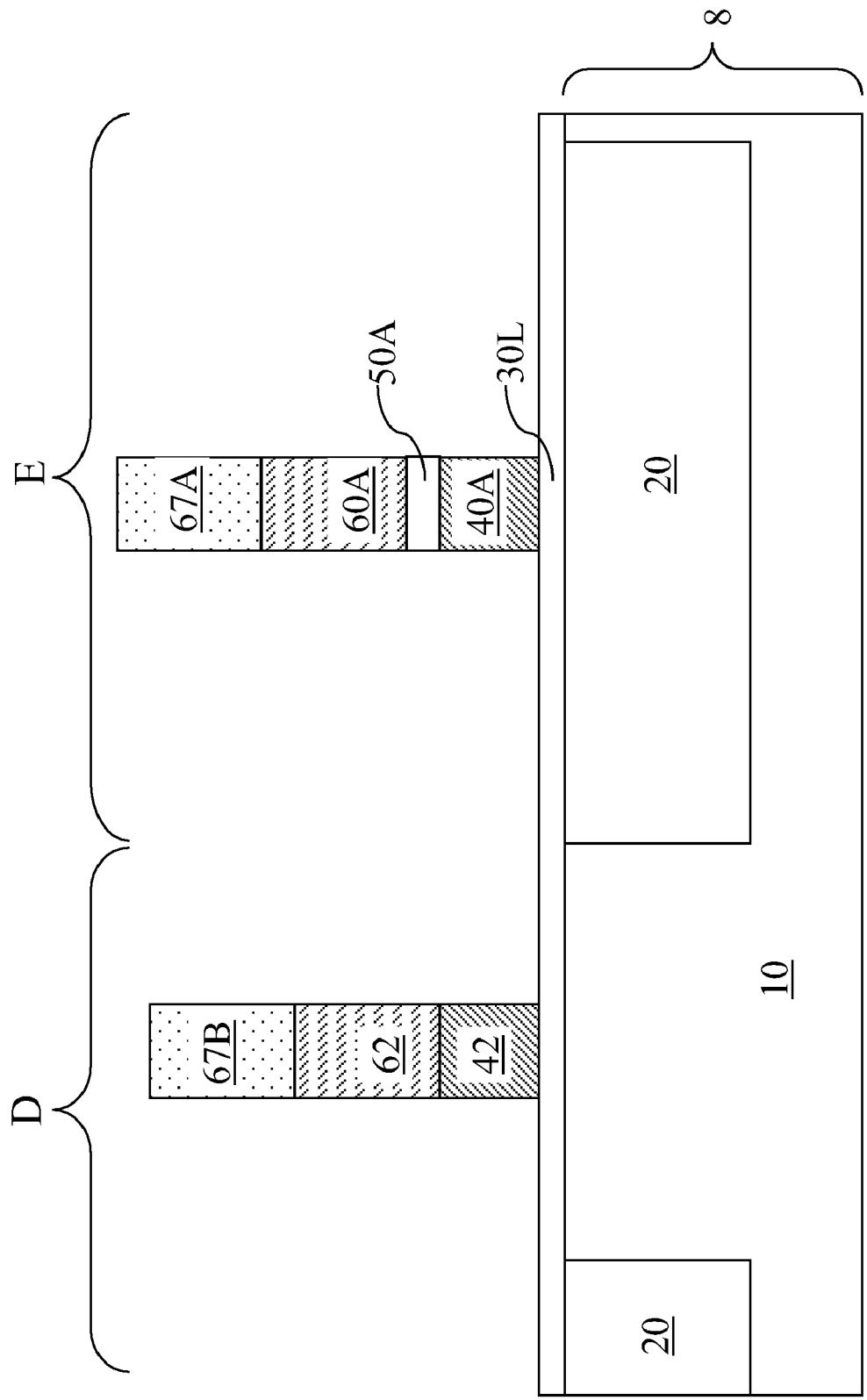
Figure 4C:
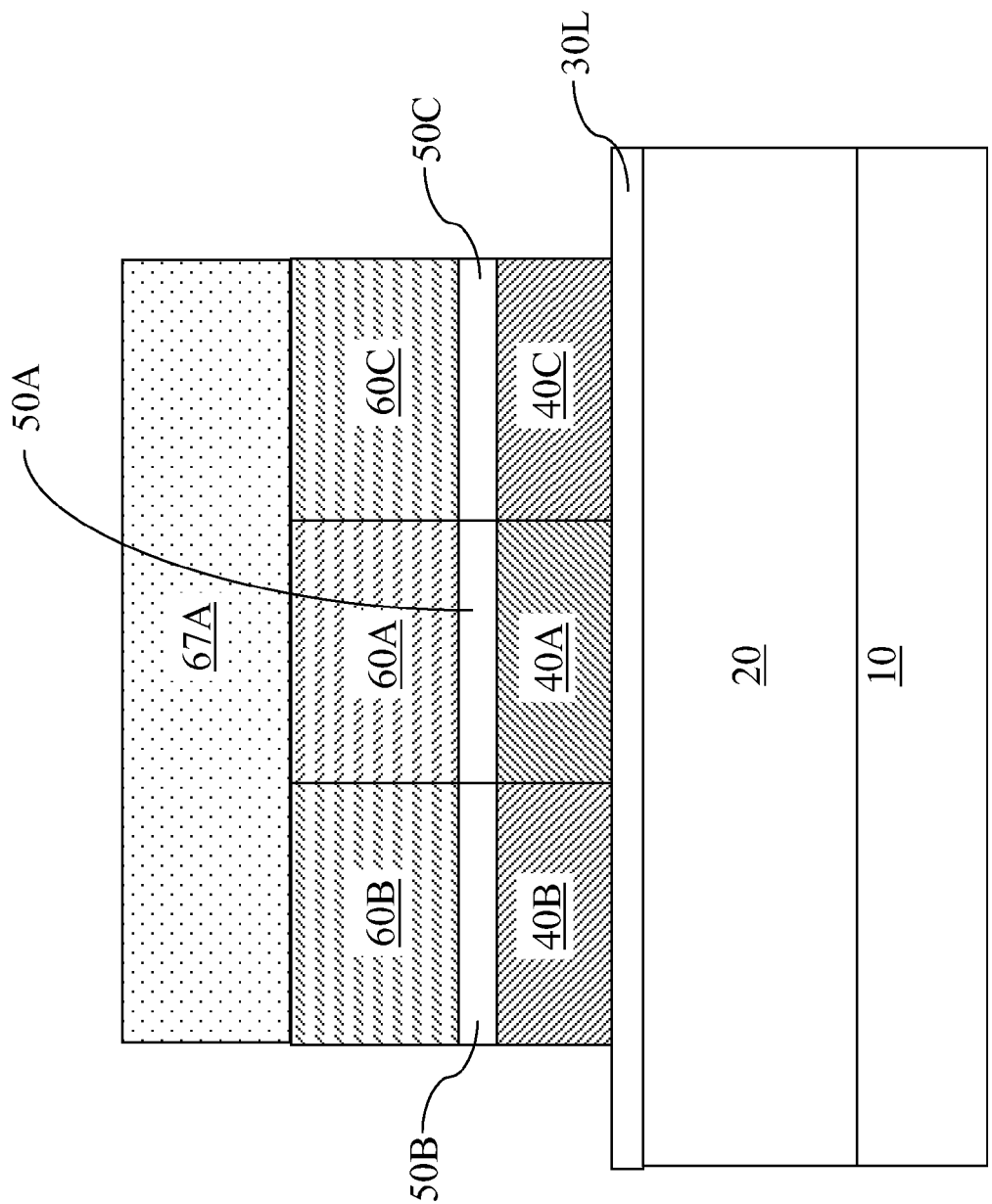

Referring to FIGS. 4A-4C, a photoresist is applied over the surface of the polycrystalline semiconductor layer 60L and lithographically patterned to form a first photoresist portion 67A in the electrical fuse region E and a second photoresist portion 67B in the device region D. The first photoresist portion 67A is in the shape of an electrical fuse, and the second photoresist portion 67B may be in the shape of a gate of a semiconductor device such as a transistor. Additional patterns may be formed in the photoresist for additional devices.

The pattern of the first photoresist portion 67A and the second photoresist portion 6B is then transferred into the stack of the polycrystalline semiconductor layer 60L (See FIGS. 3A-3C), the dielectric material portion 50 (See FIGS. 3B and 3C), and the metal gate layer 40L (See FIGS. 3B and 3C) by a reactive ion etch. Preferably, the reactive ion etch is selective to the gate dielectric layer 30L. Also preferably, the reactive ion etch is not selective to the dielectric material portion 50.

The electrical fuse region E contains the first photoresist portion 67A, a first polycrystalline semiconductor portion, which is the remaining portion of the polycrystalline semiconductor layer 60L in the electrical fuse region E, the dielectric material portion, which is reduced in size after the reactive ion etch, and a first metal gate portion, which is the remaining portion of the metal gate layer 40L in the electrical fuse portion E.

The first polycrystalline semiconductor portion comprises a first polycrystalline semiconductor sub-portion 60A, a second polycrystalline semiconductor sub-portion 60B, and a third polycrystalline semiconductor sub-portion 60C. Likewise, the dielectric material portion comprises a first dielectric material sub-portion 50A, a second dielectric material sub-portion 50B, and a third dielectric material sub-portion 50C. Similarly, the first metal gate portion comprises a first metal gate sub-portion 40A, a second metal gate sub-portion 40B, and a third metal gate sub-portion 40C. Each of the first polycrystalline semiconductor portion (60A, 60B, 60C), the dielectric material portion (50A, 50B, 50C), and the first metal gate portion (40A, 40B, 40C) have the same horizontal cross-sectional area as the first photoresist portion 67A.

The device region D contains the second photoresist portion 67B; a second polycrystalline semiconductor portion 62, which is the remaining portion of the polycrystalline semiconductor layer 60L in the device region E; and a second metal gate portion 42, which is the remaining portion of the metal gate layer 40L in the device portion D.

Figure 5A:
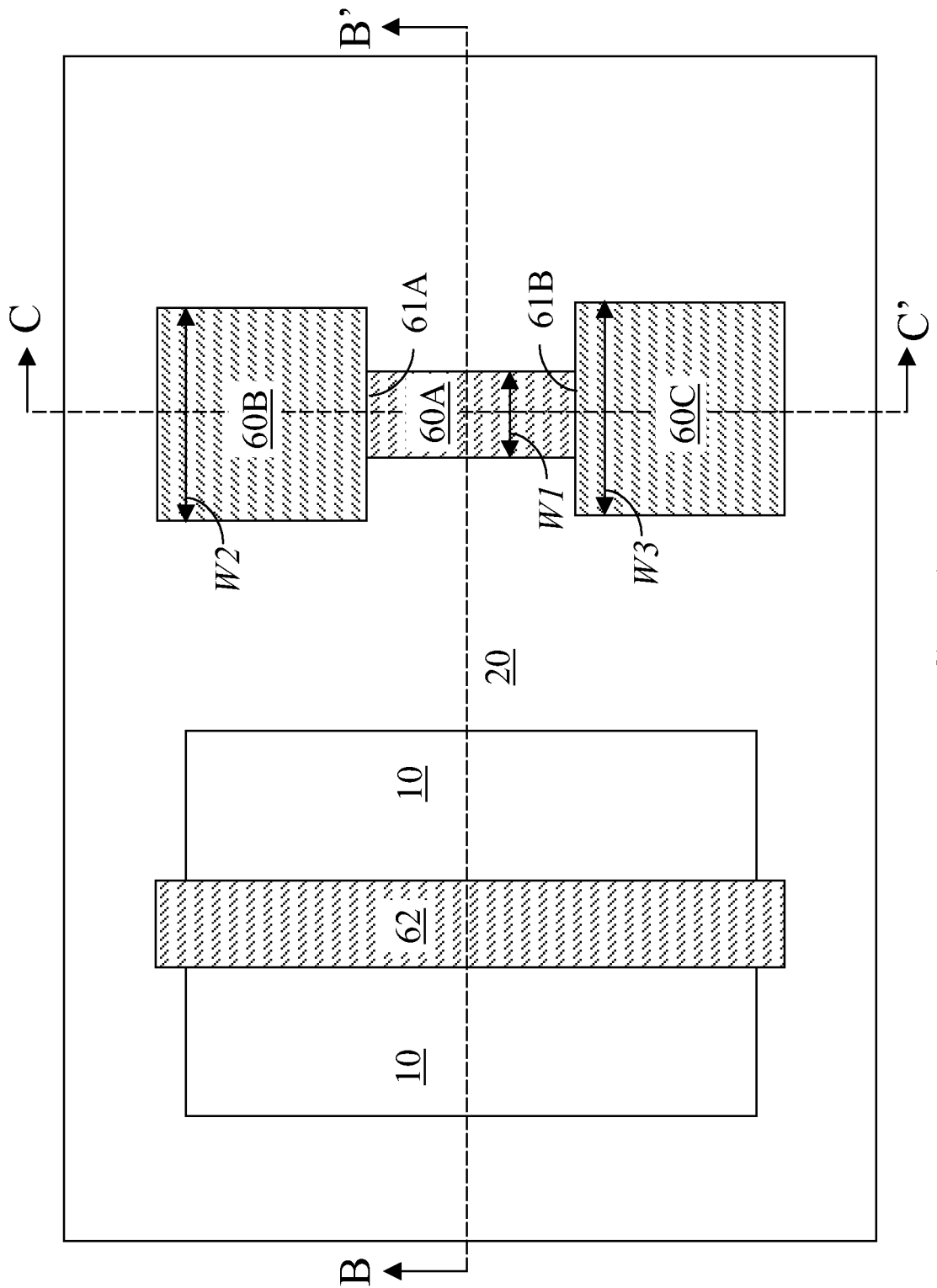
Figure 5B:
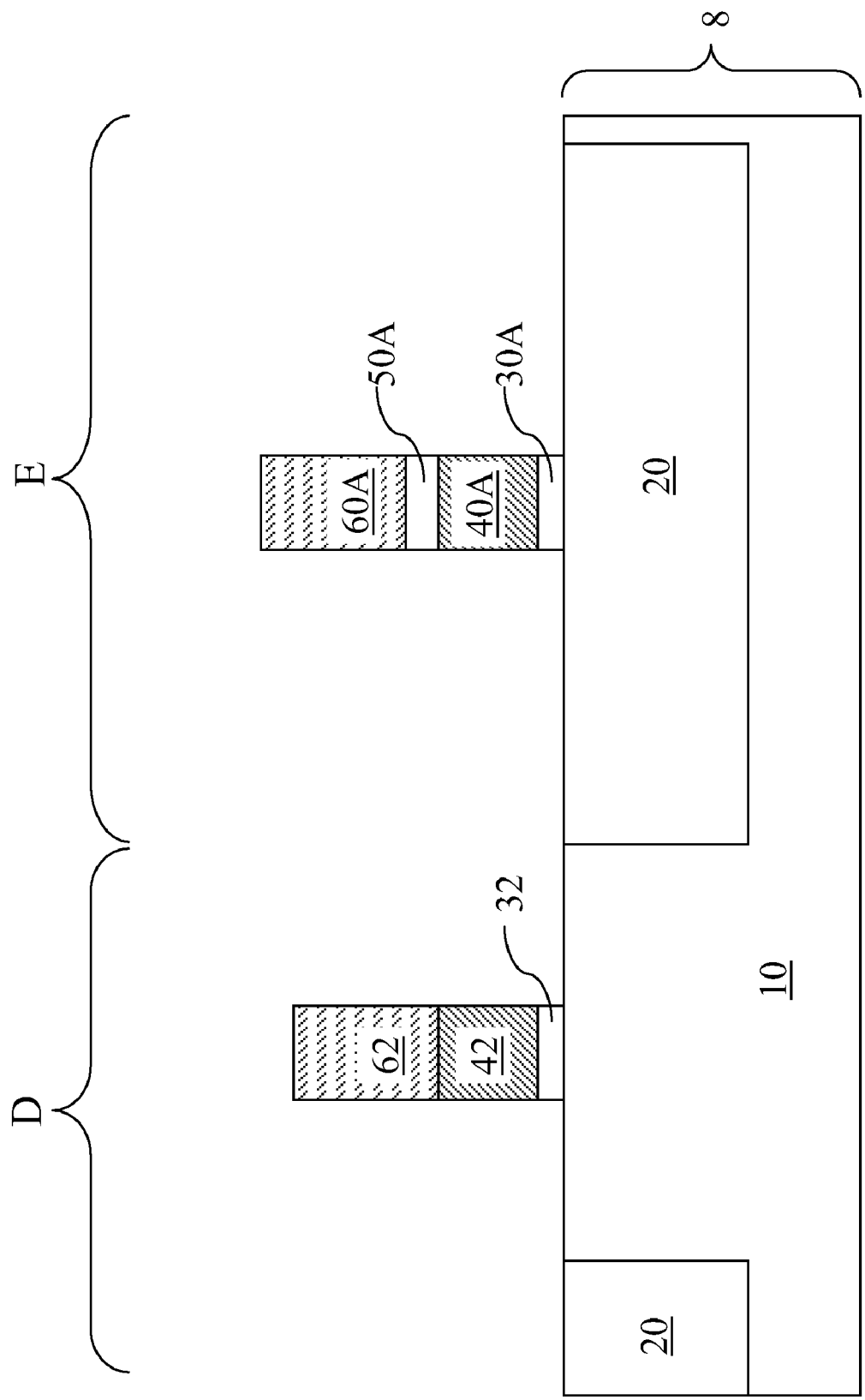
Figure 5C:
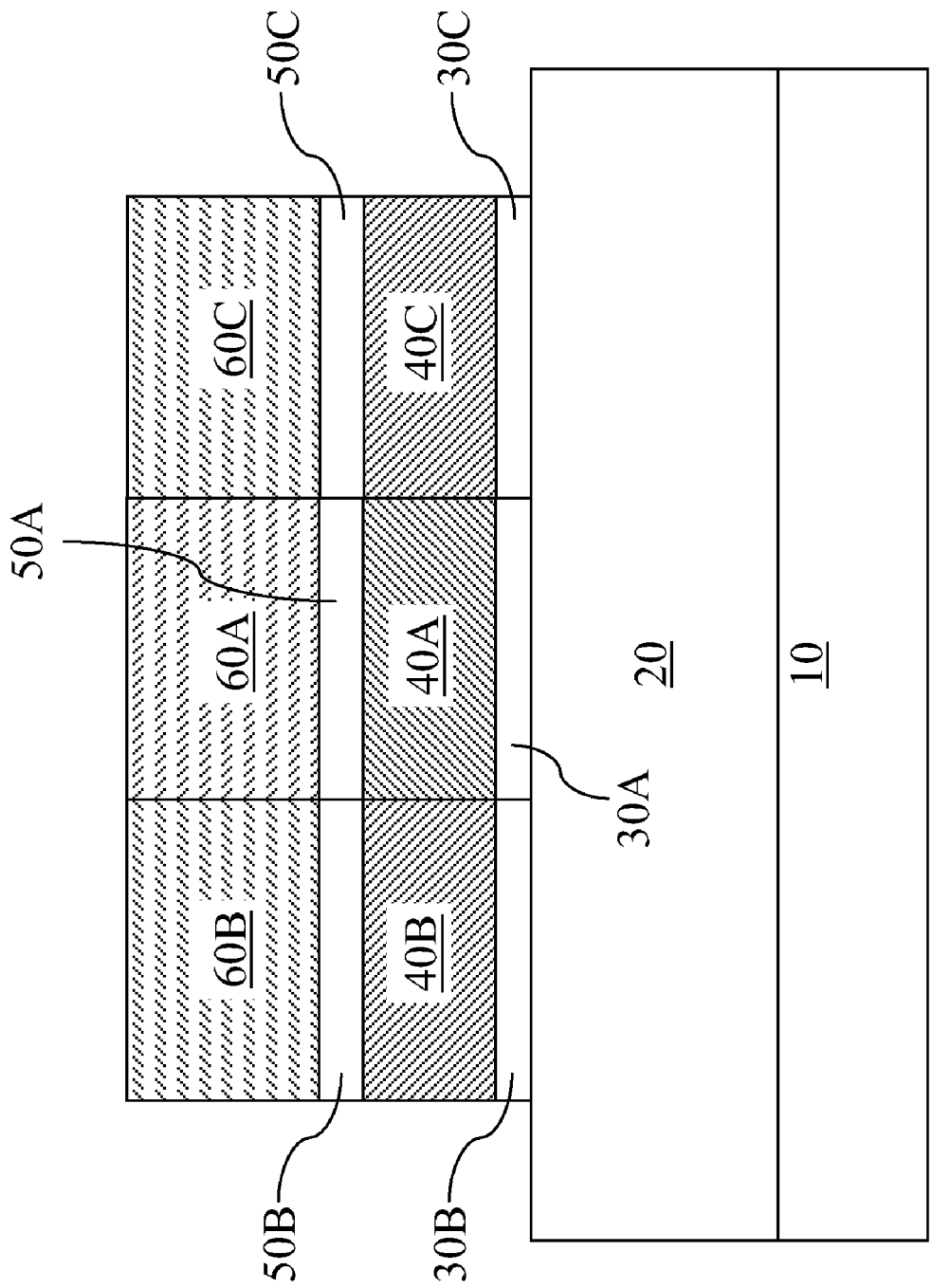

Referring to FIGS. 5A-5C, the gate dielectric layer 30L (See FIGS. 4A-4C) is etched, for example, by a reactive ion etch or by a wet etch, to from a first gate dielectric portion in the electrical fuse region E and a second gate dielectric portion 32 in the device region D. The first gate dielectric portion comprises a first gate dielectric sub-portion 30A, a second gate dielectric sub-portion 30B, and a third gate dielectric sub-portion 30C. The first photoresist portion 67A, the second photoresist portion 67B, and any other remaining portions of the photoresist are removed, for example, by ashing.

A widthwise edge 61A of the first polycrystalline semiconductor sub-portion 60A laterally abuts the second polycrystalline semiconductor sub-portion 60B and another widthwise edge 61B of the first polycrystalline semiconductor sub-portion 60A laterally abuts the third polycrystalline semiconductor sub-portion 60C. A first width W1 of the first polycrystalline semiconductor sub-potion 60A is less than a second width W2 of the second polycrystalline semiconductor sub-portion 60B, and is less than a third width W3 of the third polycrystalline semiconductor sub-portion 60C. The first width W1, the second width W2, and the third width W3 are measured in the direction of the widthwise edges (61A, 61B).

Each of the first dielectric material sub-portion 50A, the first metal gate sub-portion 40A, and the first gate dielectric sub-portion 30A have substantially the same cross-sectional area as the first polycrystalline semiconductor sub-portion 60A. Likewise, each of the second dielectric material sub-portion 50B, the second metal gate sub-portion 40B, and the second gate dielectric sub-portion 30B have substantially the same cross-sectional area as the second polycrystalline semiconductor sub-portion 60B. Similarly, each of the third dielectric material sub-portion 50A, the third metal gate sub-portion 40A, and the third gate dielectric sub-portion 30A have substantially the same cross-sectional area as the third polycrystalline semiconductor sub-portion 60A.

The first dielectric material sub-portion 50A laterally abuts the second dielectric material sub-portion 50B and the third dielectric material sub-potion 50C. The first metal gate sub-portion 40A laterally abuts the second metal gate sub-portion 40B and the third metal gate sub-potion 40C. The first gate dielectric sub-portion 30A laterally abuts the second gate dielectric sub-portion 30B and the third gate dielectric sub-potion 30C.

The second metal gate sub-portion 42 and the second gate dielectric sub-portion 32 have substantially the same cross-sectional area as the second polycrystalline semiconductor sub-portion 62.

Figure 6A:
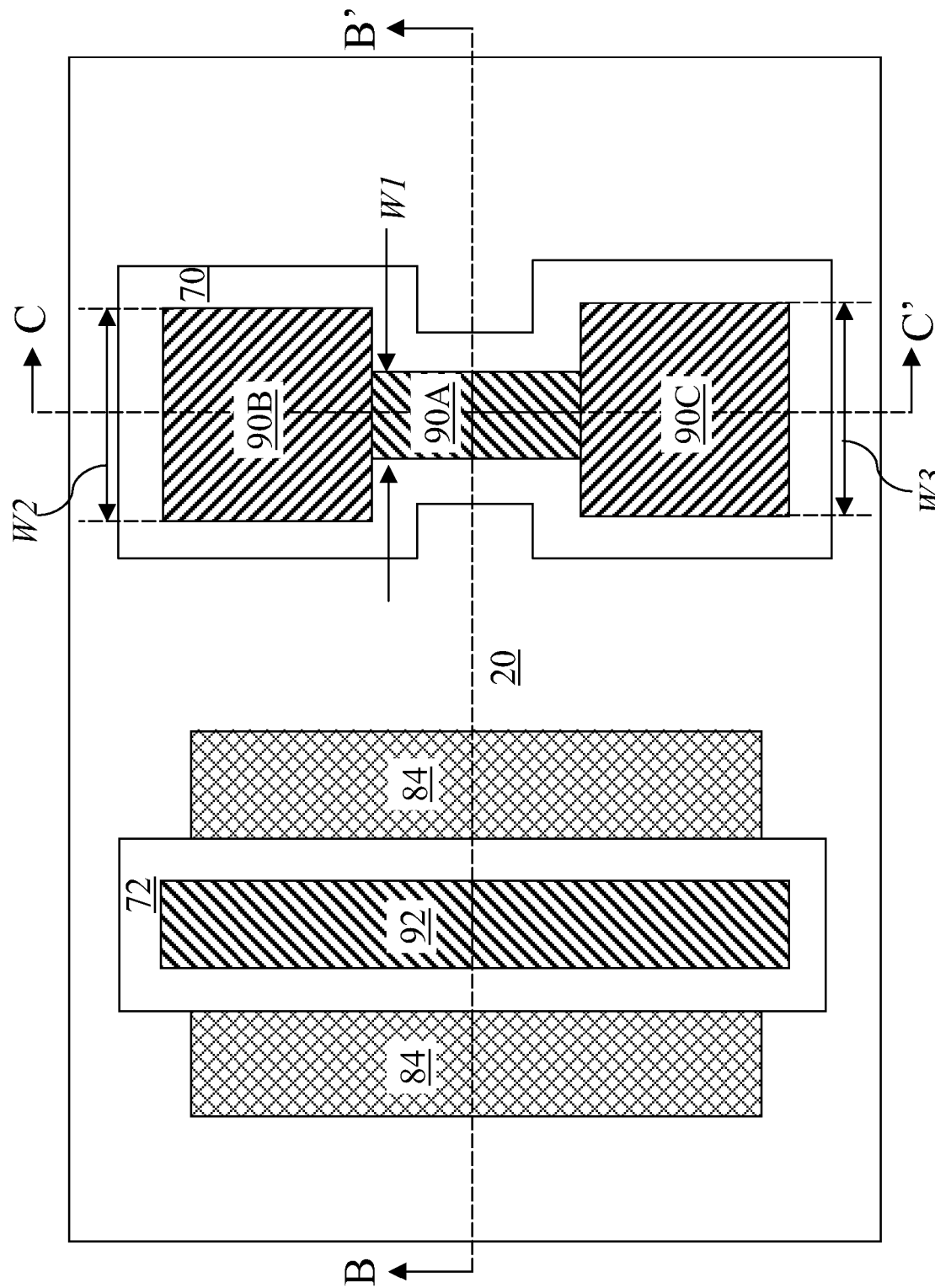
Figure 6B:
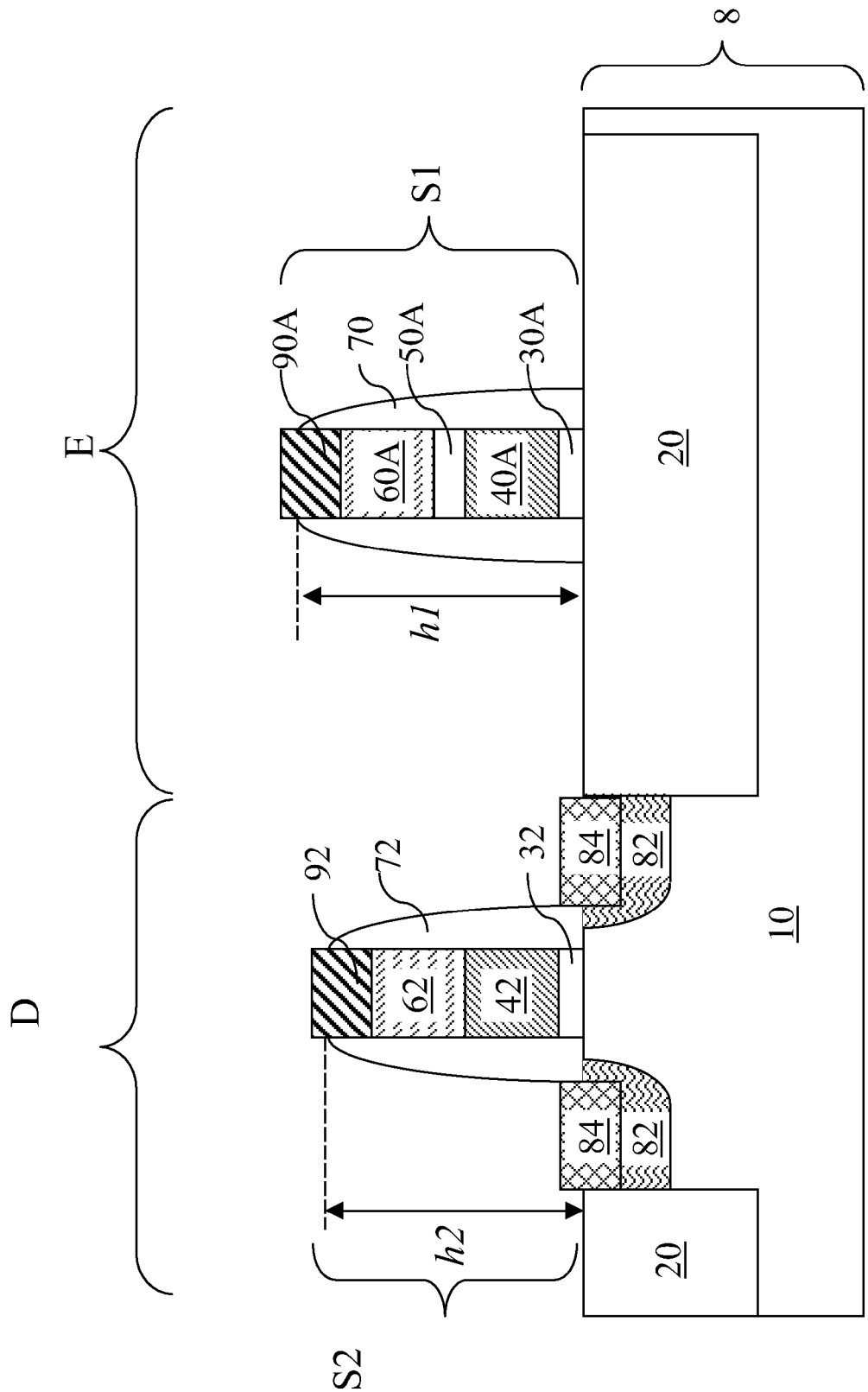
Figure 6C:
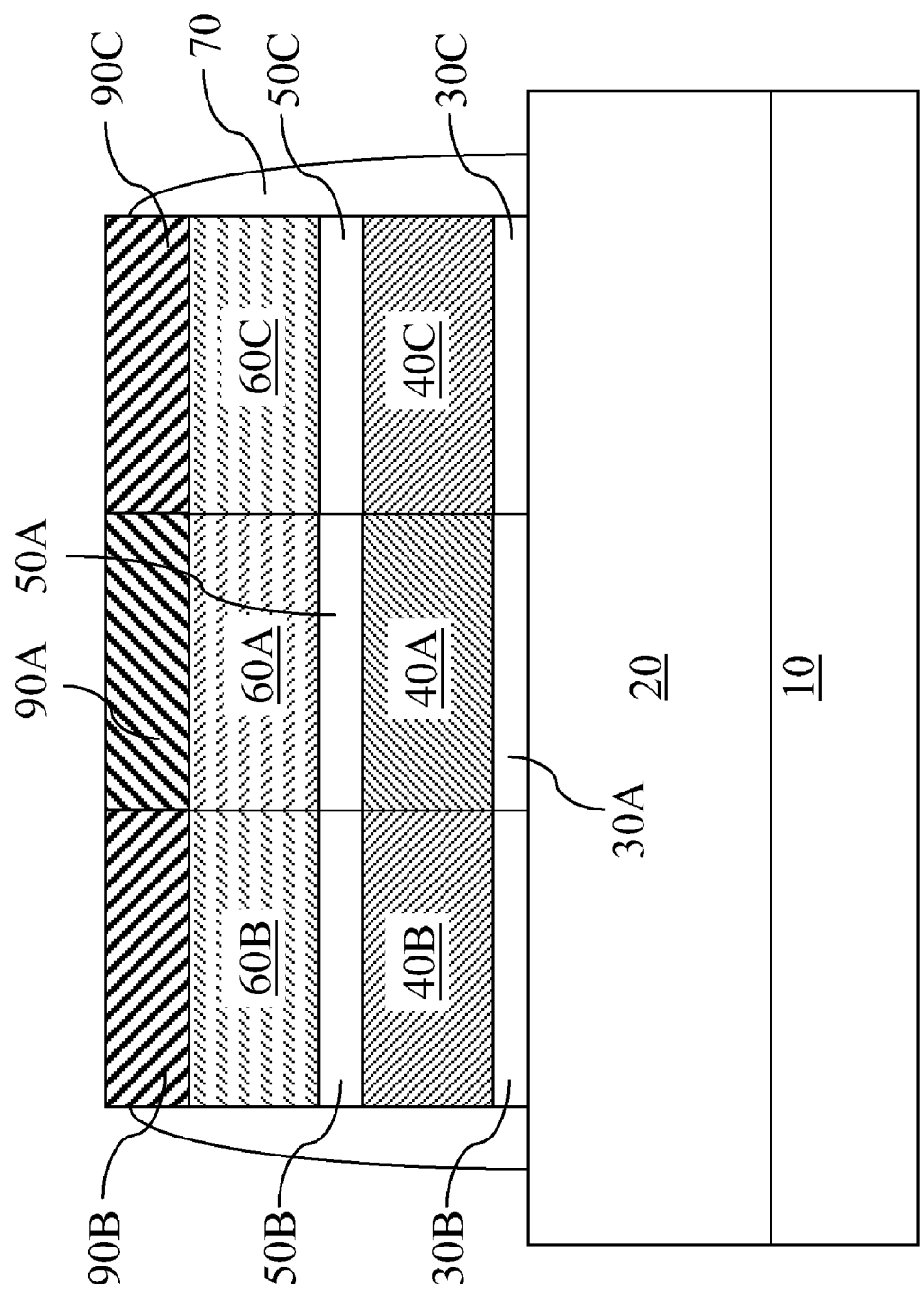

Referring to FIGS. 6A-6C, a first dielectric spacer 70 may be formed on the sidewalls of a stack comprising the first polycrystalline semiconductor portion (60A, 60B, 60C), the dielectric material portion (50A, 50B, 50C), the first metal gate portion (40A, 40B, 40C), and the first gate dielectric portion (30A, 30B, 30C) by a conformal deposition of a dielectric layer followed by an anisotropic etch such as a reactive ion etch. A second dielectric spacer 72 is formed on the sidewalls of another stack comprising the second polycrystalline semiconductor portion 62, the second metal gate portion 42, and the second gate dielectric portion 32.

Source and drain ion implantation may be performed to implants dopants into portions of the substrate layer 10 to form source and drain regions 82 in the device region D. The second stack S2, the second dielectric spacer 72, the source and drain regions 82, and a portion of the substrate layer 10 directly underneath the second gate dielectric portion 32 collectively constitute a field effect transistor. While a field effect transistor is formed in the device region D in the first exemplary semiconductor device, formation of other semiconductor devices such as bipolar transistors, junction transistors, diodes, silicon controlled rectifiers, resistors, capacitors, inductors in addition to, or in place of, the field effect transistor is explicitly contemplated herein.

Metallization is performed on the exposed semiconductor material portions by reacting a metal with the exposed semiconductor material. Specifically, a first metal semiconductor alloy portion is formed by metallization of the first polycrystalline semiconductor portion (60A, 60B, 60C). The first metal semiconductor alloy portion comprises a first metal semiconductor alloy sub-portion 90A, a second metal semiconductor alloy sub-portion 90B, and a third metal semiconductor alloy sub-portion 90C. The first metal semiconductor alloy sub-portion 90A is formed directly on, and has the same horizontal cross-sectional shape as, the first polycrystalline semiconductor sub-portion 60A. The second metal semiconductor alloy sub-portion 90B is formed directly on, and has the same horizontal cross-sectional shape as, the second polycrystalline semiconductor sub-portion 60B. The third metal semiconductor alloy sub-portion 90C is formed directly on, and has the same horizontal cross-sectional shape as, the third polycrystalline semiconductor sub-portion 60C.

Source and drain metal semiconductor alloy portions 84 may be formed in the device region D by reaction of the metal with the source and drain regions 82. In general, other metal semiconductor alloy portions may be formed in a similar manner. Methods of forming various metal semiconductor alloys are known in the art. In case the first and second polycrystalline semiconductor portions (60A, 60B, 60C, 62) comprise silicon, the first and second metal semiconductor alloy portions (90A, 90B, 90C, 92) comprise a metal silicide such as such as nickel silicide ($NiSi_x$), cobalt silicide ($CoSi_x$), tantalum silicide ($TaSi_x$), and titanium silicide ($TiSi_x$), tungsten silicide ($WSi_x$), platinum silicide ($PtSi_x$) or alloys thereof, in which values of x may be typically between 1 and 3.

Thus, the electrical fuse region E contains a first stack S1 comprising the first metal semiconductor alloy portion (90A, 90B, 90C), the first polycrystalline semiconductor portion (60A, 60B, 60C), the dielectric material portion (50A, 50B, 50C), the first metal gate portion (40A, 40B, 40C), and the first gate dielectric portion (30A, 30B, 30C), which is located directly on the shallow trench isolation structure 20. The device region D contains a second stack S2 comprising the second metal semiconductor alloy portion 92, the second polycrystalline semiconductor portion 62, the second metal gate portion 42, and the second gate dielectric portion 32, which is located directly on the substrate layer 10.

Due to the presence of the dielectric material portion (50A, 50B, 50C) in the electrical fuse region E and absence of a corresponding structure in the device region D, the height of the first stack S1 is different from the height of the second stack S2. Thus, a first height h1 of the first dielectric spacer 70, which is a vertical distance between a highest point of the first dielectric spacer 70 and a lowest point of the same first dielectric spacer 70, is greater than a second height h2 of the second dielectric spacer, which is a vertical distance between a highest point of the second dielectric spacer 72 and a lowest point of the same second dielectric spacer 72.

The first metal semiconductor alloy sub-portion 90A and the first polycrystalline semiconductor sub-portion 60A collectively comprise a fuselink of an electrical fuse. The second metal semiconductor alloy sub-portion 90B and the second polycrystalline semiconductor sub-portion 60B collectively comprise an anode of the electrical fuse. The third metal semiconductor alloy sub-portion 90C and the third polycrystalline semiconductor sub-portion 60C collectively comprise a cathode of the electrical fuse. The fuselink (90A, 60A), the anode (90B, 60B), and the cathode (90C, 60C) collectively constitute the electrical fuse (90A, 90B, 90C, 60A, 60B, 60C).

Thus, the electrical fuse comprises:

a first sub-portion, which is the first polycrystalline semiconductor sub-portion 60A, of the first polycrystalline semiconductor portion (60A, 60B, 60C);

a second sub-portion, which is the second polycrystalline semiconductor sub-portion 60B, of the first polycrystalline semiconductor portion (60A, 60B, 60C); and a third sub-portion, which is the third polycrystalline semiconductor sub-portion 60C, of the first polycrystalline semiconductor portion (60A, 60B, 60C), wherein a widthwise edge of the first sub-portion abuts the second sub-portion and another widthwise edge of the first sub-portion abuts the third sub-portion, and wherein a first width of the first sub-potion is less than a second width of the second sub-portion and is less than a third width of the third sub-portion.

The electrical fuse (90A, 90B, 90C, 60A, 60B, 60C) is separated from the first metal gate portion (40A, 40B, 40C) by the dielectric material portion (50A, 50B, 50C). Despite the presence of the first metal gate portion (40A, 40B, 40C) and other metal gate structures including the second metal gate portion 42, the electrical fuse (90A, 90B, 90C, 60A, 60B, 60C) does not directly contact the conductive metallic material employed in any metal gate structure. Absence of direct contact with the conductive metallic material renders the programming of the electrical fuse (90A, 90B, 90C, 60A, 60B, 60C) amenable to programming under electrical bias with a high post-programming resistance. In other words, the electrical fuse (90A, 90B, 90C, 60A, 60B, 60C) is programmable under conventional programming conditions, i.e., under conventional voltage bias and current, while allowing construction of other semiconductor devices employing a metal gate structure on the same semiconductor substrate 8.

Sidewalls of the first polycrystalline semiconductor portion (60A, 60B, 60C) are directly adjoined to, and are coincident with, sidewalls of the dielectric material portion (50A, 50B, 50C).

Figure 7A:
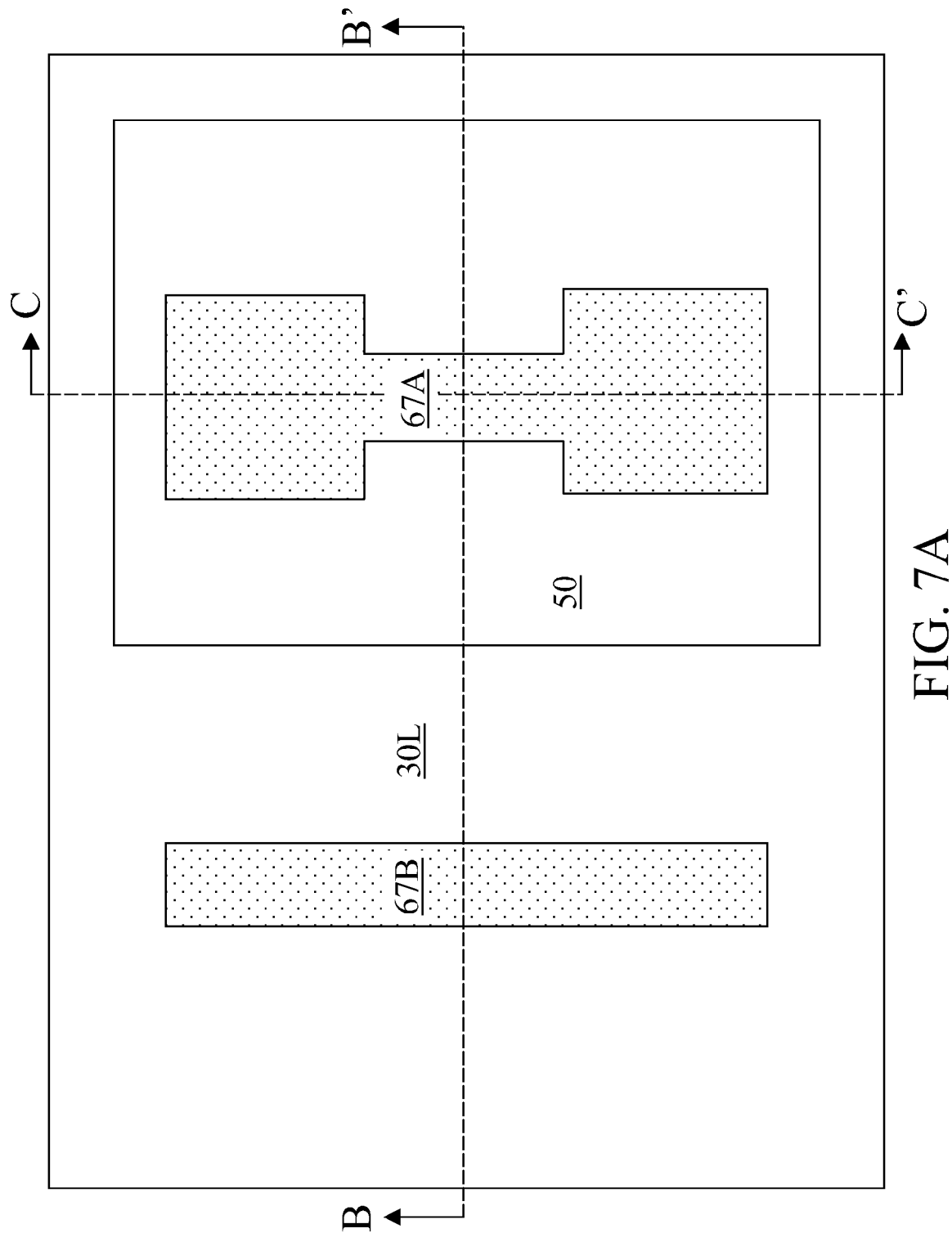
FIGS. 7A-9C are sequential views of a second exemplary structure according to a second embodiment of the present invention. Figures with the same numeric label correspond to the same stage of manufacturing; figures with the suffix "A" are top-down views; figures with the suffix "B" or "C" are vertical cross-sectional views along the plane B-B' or the plan C-C', respectively, of the corresponding figure with the same numeric label and the suffix "A."
Figure 7B:
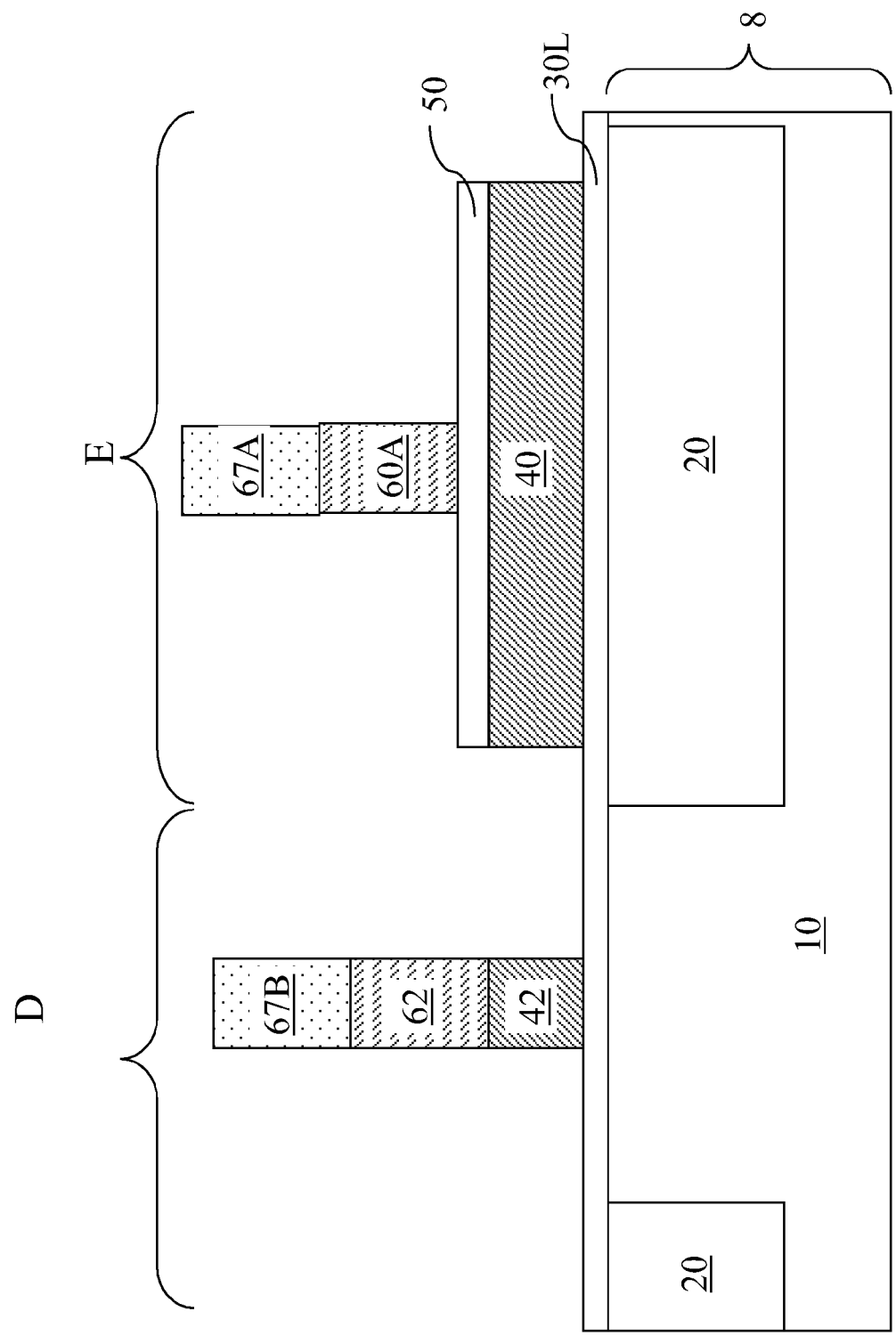
Figure 7C:
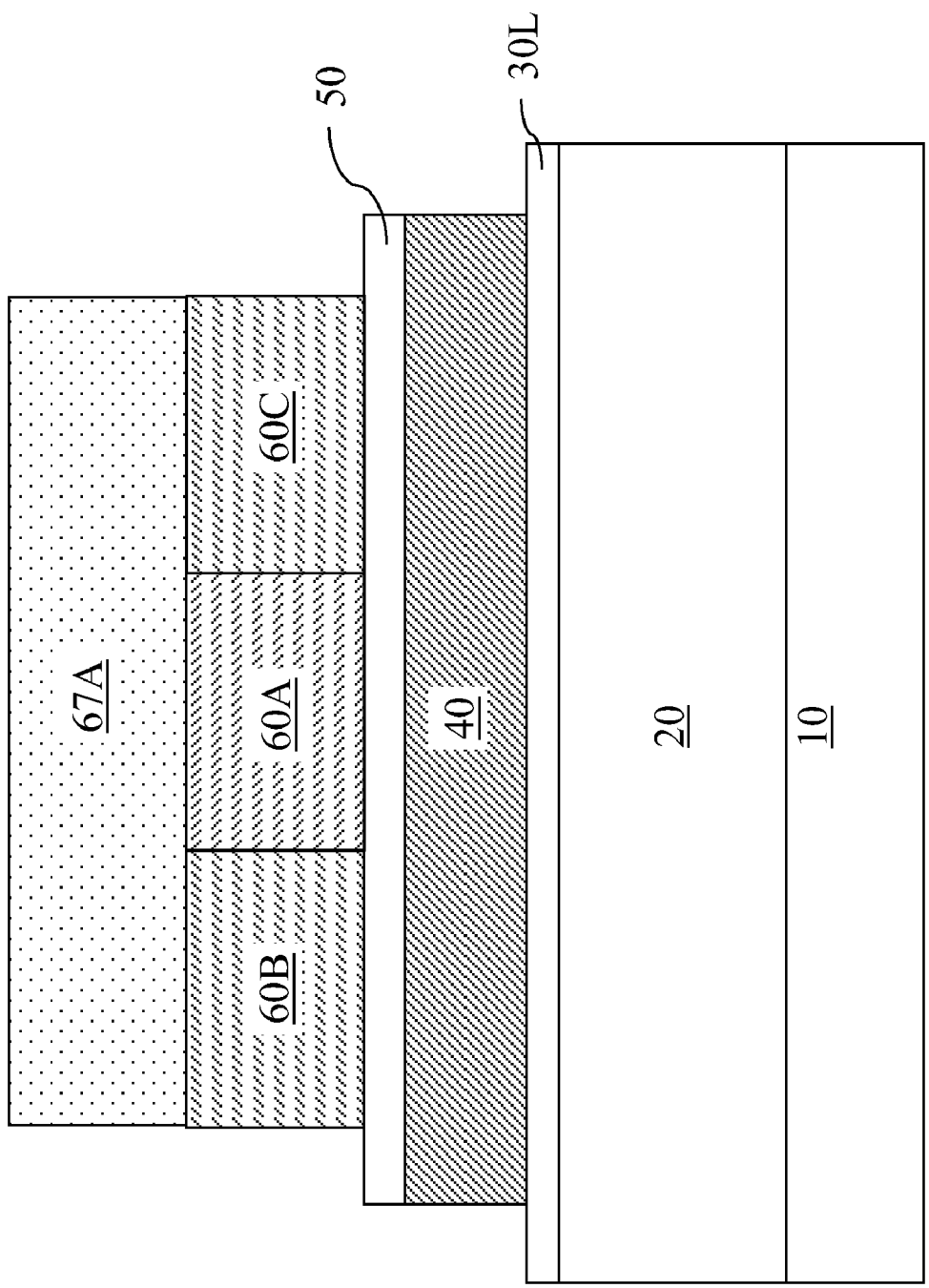

Referring to FIGS. 7A-7C, a second exemplary semiconductor structure according to a second embodiment of the present invention is derived from the first exemplary semiconductor structure of FIGS. 3A-3C by applying and lithographically patterning a photoresist over the surface of the polycrystalline semiconductor layer 60L to form a first photoresist portion 67A in the electrical fuse region E and a second photoresist portion 67B in the device region D. The first photoresist portion 67A is in the shape of an electrical fuse, and the second photoresist portion 67B may be in the shape of a gate of a semiconductor device such as a transistor. Additional patterns may be formed in the photoresist for additional devices.

The pattern of the first photoresist portion 67A and the second photoresist portion 6B is then transferred into the stack of the polycrystalline semiconductor layer 60L (See FIGS. 3A-3C) by a reactive ion etch. The reactive ion etch is selective to the dielectric material portion 50. Thus, the reactive ion etch does not etch the dielectric material portion 50 and a first metal gate portion 40 directly underneath the dielectric material portion 50, which is a remaining portion of the metal gate layer 40L (See FIGS. 3B and 3C) having substantially the same horizontal cross-sectional shape as the dielectric material portion 50. Preferably, the reactive ion etch is selective to the gate dielectric layer 30L.

The electrical fuse region E contains the first photoresist portion 67A, a first polycrystalline semiconductor portion, which is the remaining portion of the polycrystalline semiconductor layer 60L in the electrical fuse region E, the dielectric material portion 50, which does not change in size during the reactive ion etch, and the first metal gate portion 40. The first polycrystalline semiconductor portion comprises a first polycrystalline semiconductor sub-portion 60A, a second polycrystalline semiconductor sub-portion, and a third polycrystalline semiconductor sub-portion 60C.

The first photoresist portion 67A and the first polycrystalline semiconductor portion (60A, 60B, 60C) have a same horizontal cross-sectional shape, which is herein referred to as a first cross-sectional shape. The dielectric material portion 50 and the first metal gate portion 40 have another same cross-sectional shape, which is herein referred to as a second cross-sectional shape. In a top-down view, such as FIG. 7A, the first cross-sectional shape, which is the shape of the first photoresist portion 67A, is fully contained within the second cross-sectional shape, which is the shape of the dielectric material portion.

The device region D contains the second photoresist portion 67B; a second polycrystalline semiconductor portion 62, which is the remaining portion of the polycrystalline semiconductor layer 60L in the device region E; and a second metal gate portion 42, which is the remaining portion of the metal gate layer 40L in the device portion D.

Figure 8A:
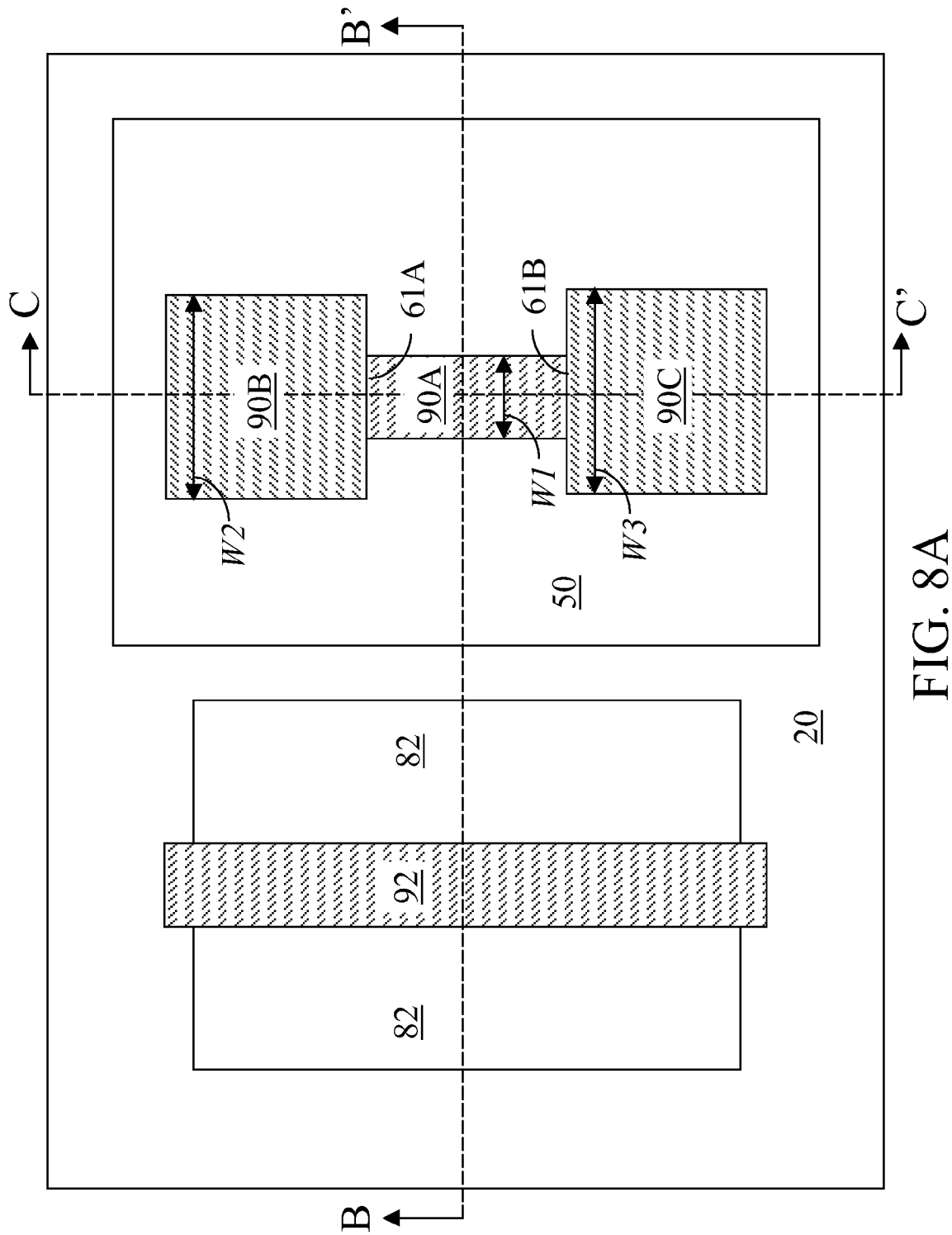
Figure 8B:
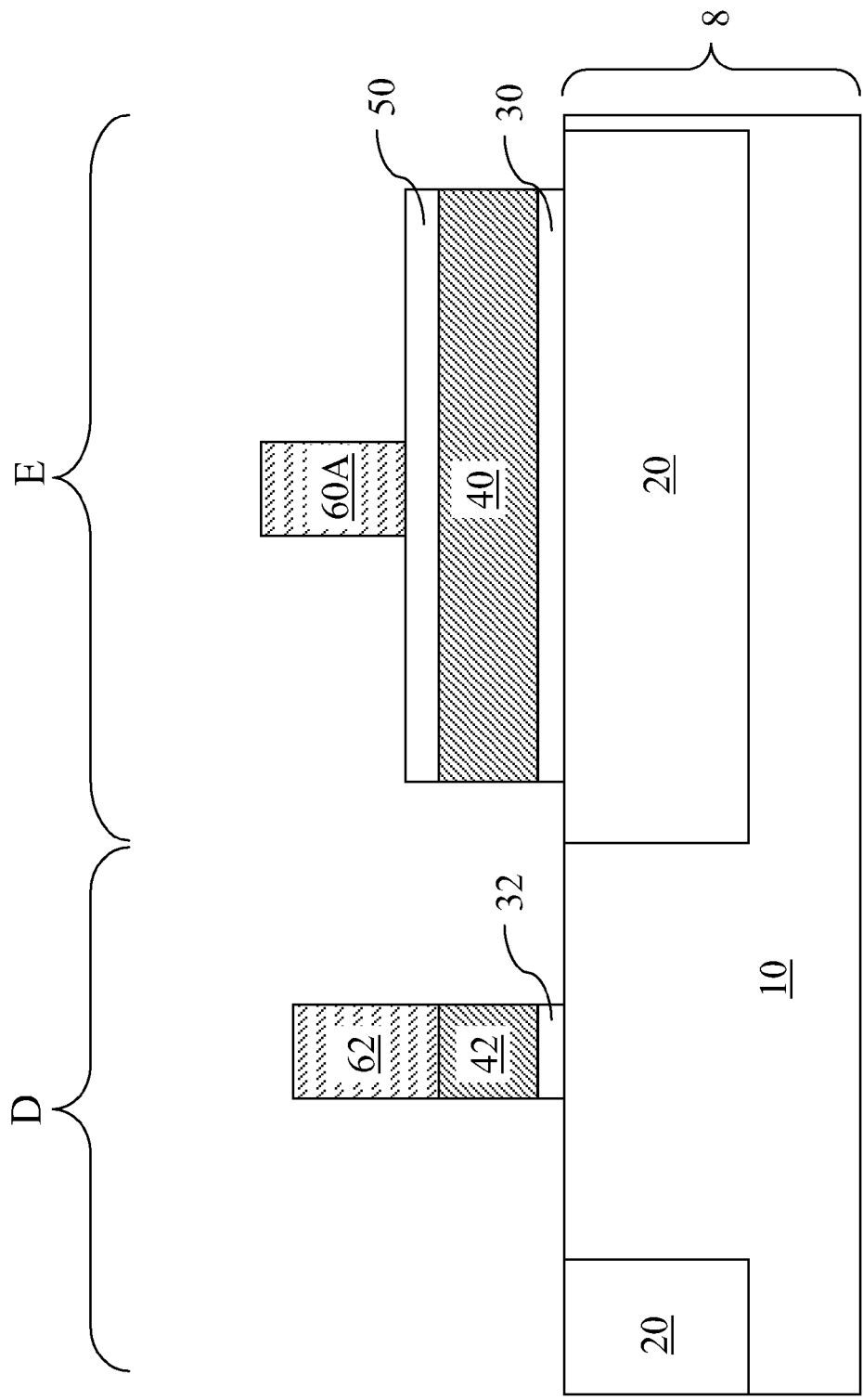
Figure 8C:
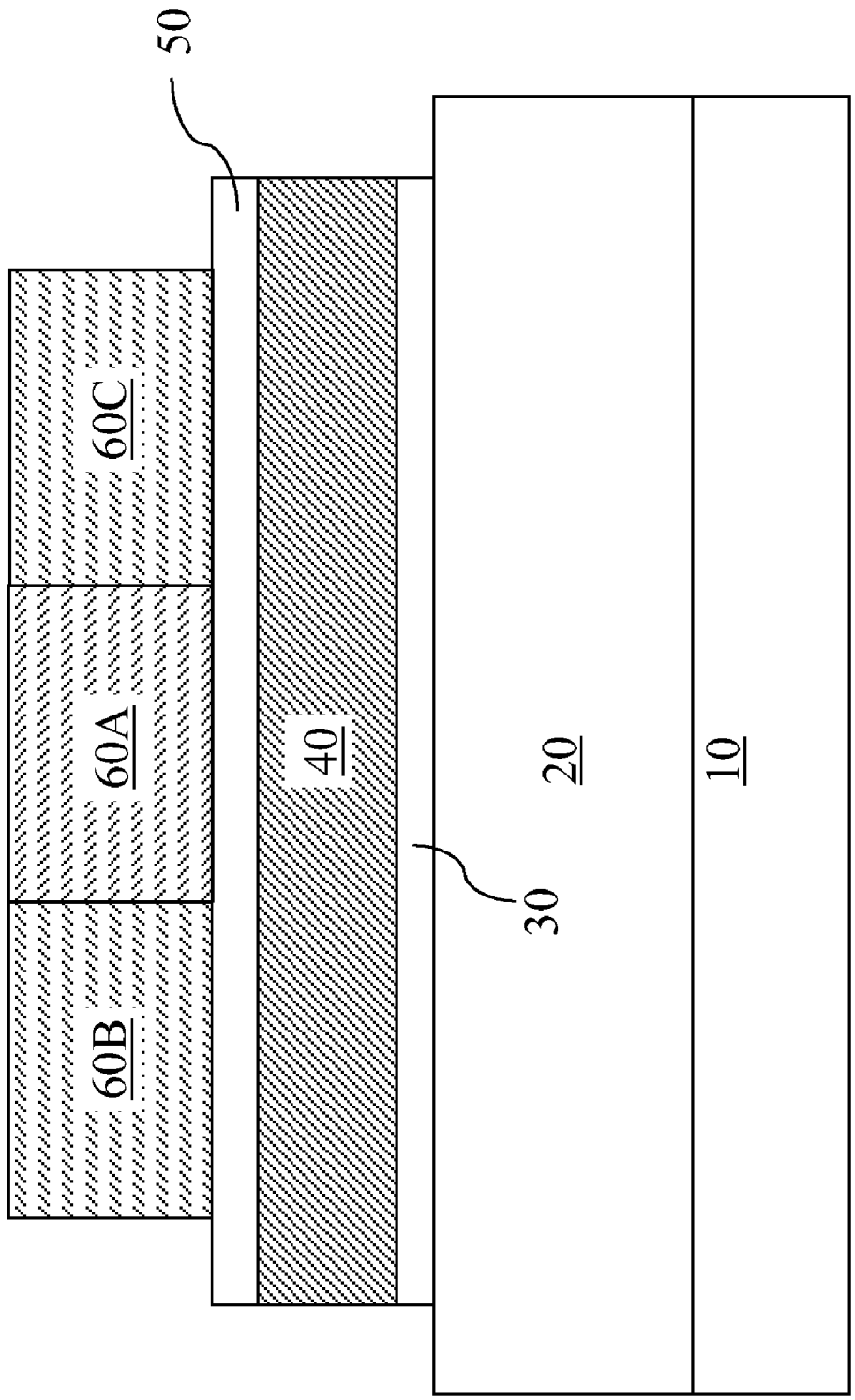

Referring to FIGS. 8A-8C, the gate dielectric layer 30L (See FIGS. 7A-7C) is etched, for example, by a reactive ion etch or by a wet etch, to from a first gate dielectric portion 30 in the electrical fuse region E and a second gate dielectric portion 32 in the device region D. A horizontal cross-sectional area of the first gate dielectric portion 30 is substantially the same as the second cross-sectional shape. The first photoresist portion 67A, the second photoresist portion 67B, and any other remaining portions of the photoresist are removed, for example, by ashing.

A widthwise edge 61A of the first polycrystalline semiconductor sub-portion 60A laterally abuts the second polycrystalline semiconductor sub-portion 60B and another widthwise edge 61B of the first polycrystalline semiconductor sub-portion 60A laterally abuts the third polycrystalline semiconductor sub-portion 60C. A first width W1 of the first polycrystalline semiconductor sub-potion 60A is less than a second width W2 of the second polycrystalline semiconductor sub-portion 60B, and is less than a third width W3 of the third polycrystalline semiconductor sub-portion 60C. The first width W1, the second width W2, and the third width W3 are measured in the direction of the widthwise edges (61A, 61B).

The second metal gate sub-portion 42 and the second gate dielectric sub-portion 32 have substantially the same cross-sectional area as the second polycrystalline semiconductor sub-portion 62.

Figure 9A:
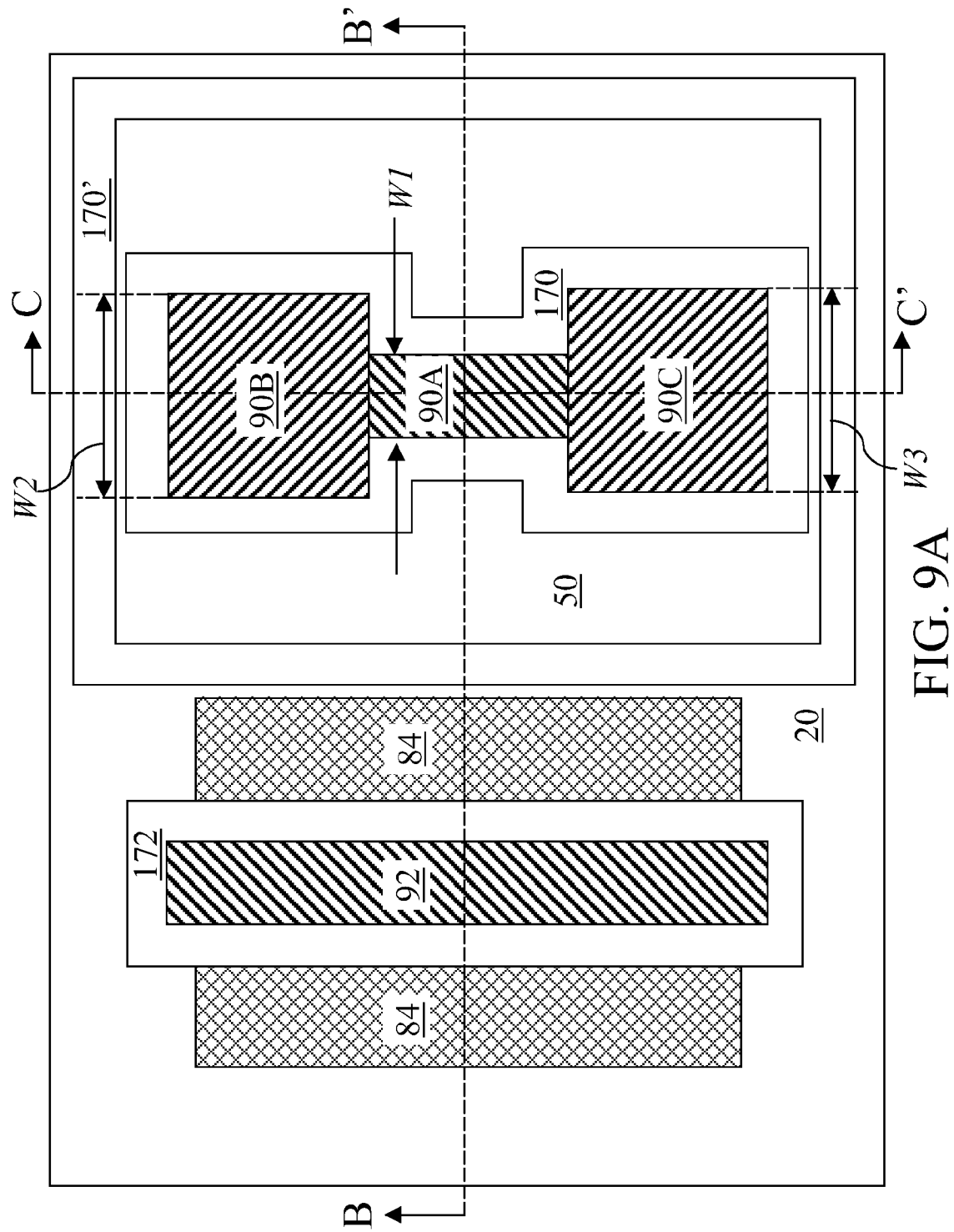
Figure 9B:
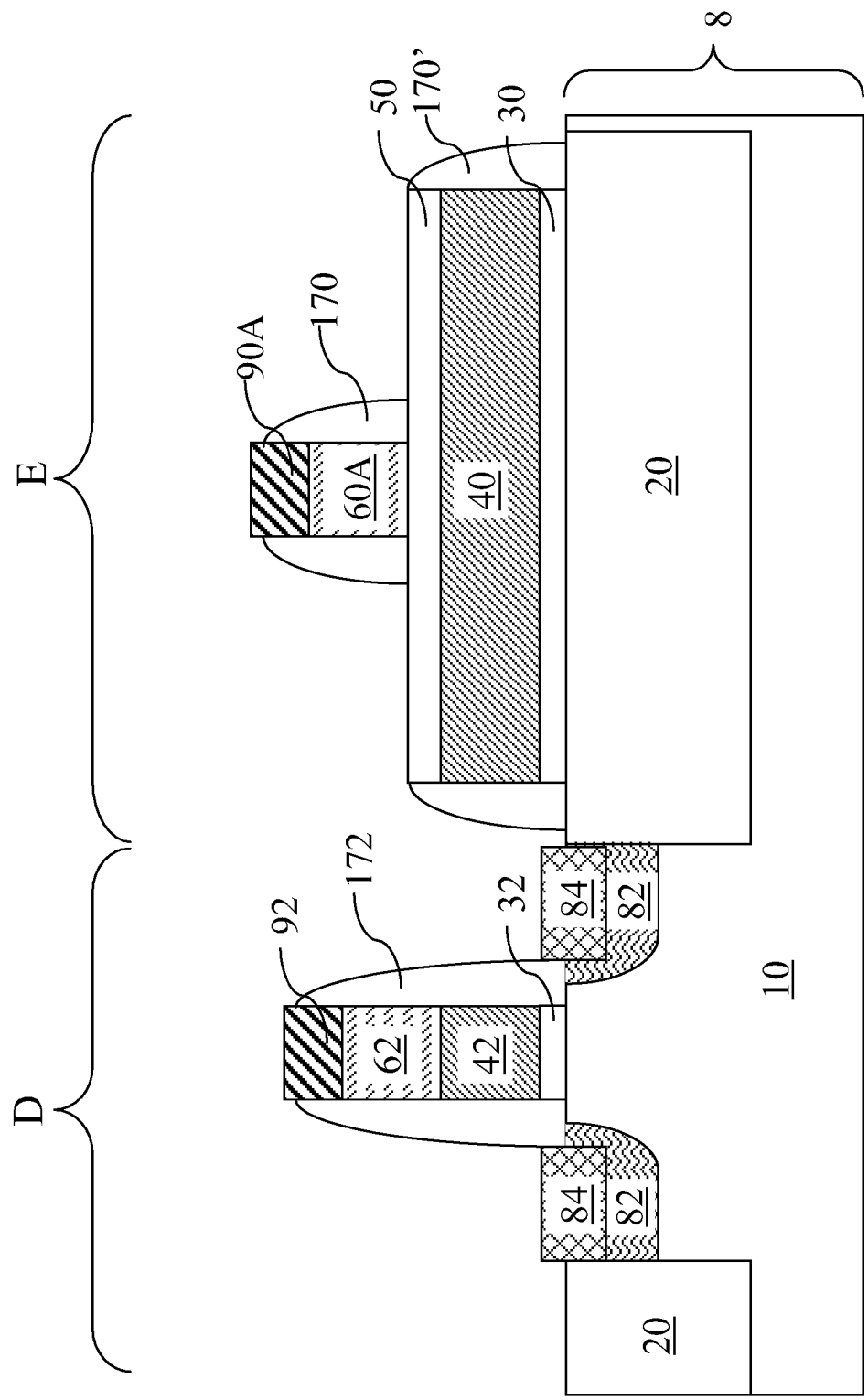
Figure 9C:
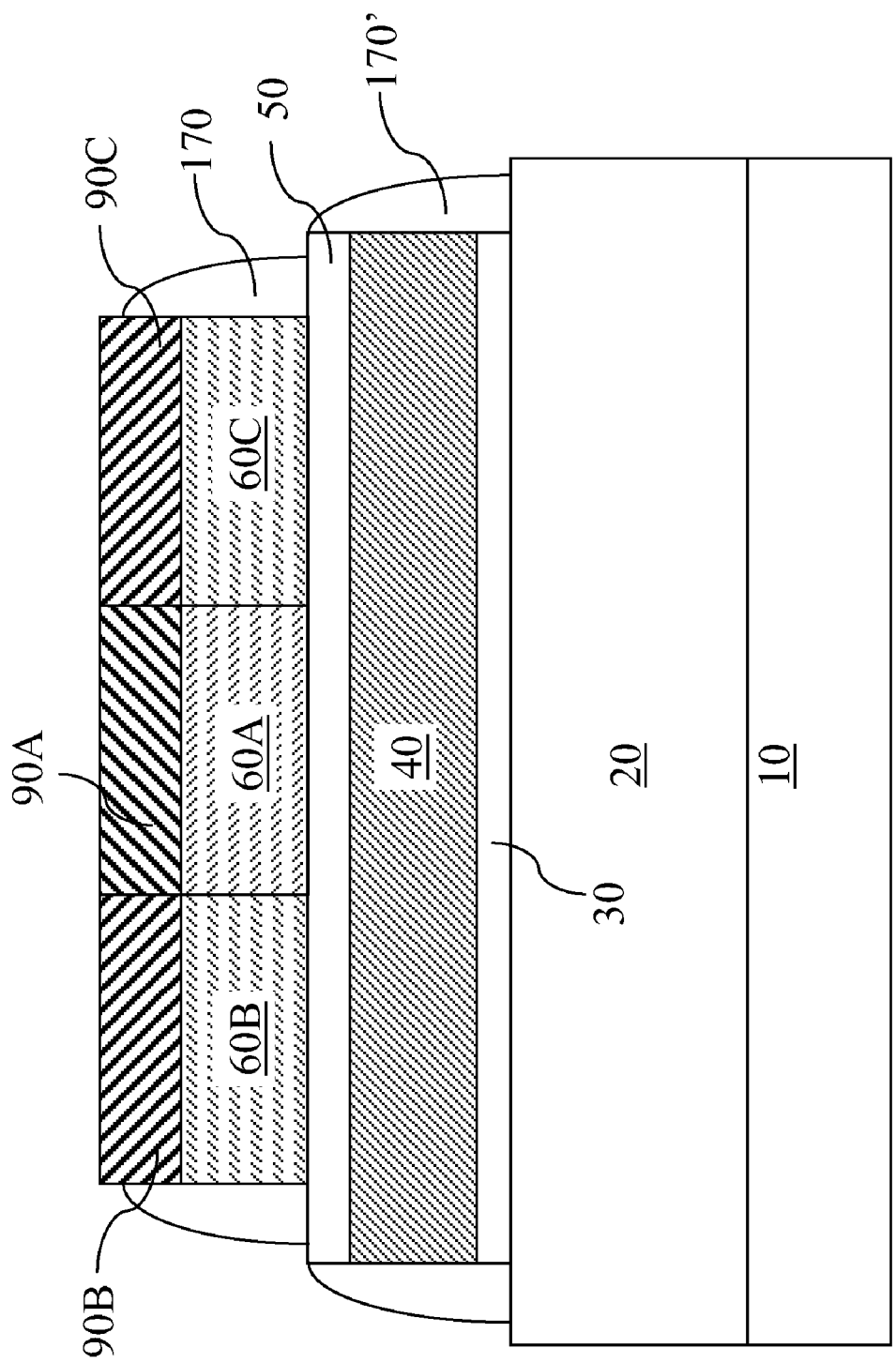

Referring to FIGS. 9A-9C, dielectric spacers may be formed by conformal deposition of a dielectric layer followed by an anisotropic etch such as a reactive ion etch. Specifically, an upper dielectric spacer 170 may be formed on sidewalls the first polycrystalline semiconductor portion (60A, 60B, 60C). A lower dielectric layer 170' may be formed on sidewalls of the dielectric material portion (50A, 50B, 50C), the first metal gate portion (40A, 40B, 40C), and the first gate dielectric portion (30A, 30B, 30C). A device region dielectric spacer 172 is formed on the sidewalls of the second polycrystalline semiconductor portion 62, the second metal gate portion 42, and the second gate dielectric portion 32.

Source and drain ion implantation may be performed to implants dopants into portions of the substrate layer 10 to form source and drain regions 82 in the device region D. The second polycrystalline semiconductor portion 62, the second metal gate portion 42, and the second gate dielectric portion 32; the device region dielectric spacer 172, the source and drain regions 82, and a portion of the substrate layer 10 directly underneath the second gate dielectric portion 32 collectively constitute a field effect transistor. While a field effect transistor is formed in the device region D in the second exemplary semiconductor device, formation of other semiconductor devices such as bipolar transistors, junction transistors, diodes, silicon controlled rectifiers, resistors, capacitors, inductors in addition to, or in place of, the field effect transistor is explicitly contemplated herein.

Metallization is performed on the exposed semiconductor material portions by reacting a metal with the exposed semiconductor material as in the first embodiment. Specifically, a first metal semiconductor alloy portion is formed by metallization of the first polycrystalline semiconductor portion (60A, 60B, 60C). The first metal semiconductor alloy portion comprises a first metal semiconductor alloy sub-portion 90A, a second metal semiconductor alloy sub-portion 90B, and a third metal semiconductor alloy sub-portion 90C. The first metal semiconductor alloy sub-portion 90A is formed directly on, and has the same horizontal cross-sectional shape as, the first polycrystalline semiconductor sub-portion 60A. The second metal semiconductor alloy sub-portion 90B is formed directly on, and has the same horizontal cross-sectional shape as, the second polycrystalline semiconductor sub-portion 60B. The third metal semiconductor alloy sub-portion 90C is formed directly on, and has the same horizontal cross-sectional shape as, the third polycrystalline semiconductor sub-portion 60C.

Source and drain metal semiconductor alloy portions 84 may be formed in the device region D by reaction of the metal with the source and drain regions 82. In general, other metal semiconductor alloy portions may be formed in a similar manner.

Thus, the electrical fuse region E contains an upper stack comprising the first metal semiconductor alloy portion (90A, 90B, 90C) and the first polycrystalline semiconductor portion (60A, 60B, 60C). The electrical fuse region E contain a lower stack containing the dielectric material portion 50, the first metal gate portion 40, and the first gate dielectric portion 30. The upper stack is located above the lower stack, which is a pedestal for the upper stack. The device region D contains another stack comprising the second metal semiconductor alloy portion 92, the second polycrystalline semiconductor portion 62, the second metal gate portion 42, and the second gate dielectric portion 32, which is located directly on the substrate layer 10.

Typically, the height of the device region dielectric layer 172, which is a vertical distance between a highest point of the device region dielectric spacer 172 and a lowest point of the same device region dielectric spacer 172, is greater than the height of the upper dielectric layer 170, which is a vertical distance between a highest point of the upper dielectric spacer 170 and a lowest point of the same upper dielectric spacer 170, and greater than the height of the lower dielectric layer 170', which is a vertical distance between a highest point of the lower dielectric spacer 170' and a lowest point of the same lower dielectric spacer 170'.

The first metal semiconductor alloy sub-portion 90A and the first polycrystalline semiconductor sub-portion 60A collectively comprise a fuselink of an electrical fuse. The second metal semiconductor alloy sub-portion 90B and the second polycrystalline semiconductor sub-portion 60B collectively comprise an anode of the electrical fuse. The third metal semiconductor alloy sub-portion 90C and the third polycrystalline semiconductor sub-portion 60C collectively comprise a cathode of the electrical fuse. The fuselink (90A, 60A), the anode (90B, 60B), and the cathode (90C, 60C) collectively constitute the electrical fuse (90A, 90B, 90C, 60A, 60B, 60C).

Sidewalls of the first polycrystalline semiconductor portion (60A, 60B, 60C) are separated from sidewalls of the dielectric material portion (50A, 50B, 50C) by a top surface of the dielectric material portion 50.

The electrical fuse (90A, 90B, 90C, 60A, 60B, 60C) is separated from the first metal gate portion (40A, 40B, 40C) by the dielectric material portion 50. Despite the presence of the first metal gate portion 40 and other metal gate structures including the second metal gate portion 42, the electrical fuse (90A, 90B, 90C, 60A, 60B, 60C) does not directly contact the conductive metallic material employed in any metal gate structure. Absence of direct contact with the conductive metallic material renders the programming of the electrical fuse (90A, 90B, 90C, 60A, 60B, 60C) amenable to programming under electrical bias with a high post-programming resistance as in the first embodiment of the present invention. Concurrent construction of the electrical fuse with normal programming characteristics, i.e., not having abnormal programming characteristics caused by a direct contact of a conductive metallic material, with other semiconductor devices employing a metal gate structure on the same semiconductor substrate 8 is enabled.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising a first structure located in a first region of a semiconductor substrate and a second structure located in a second region of said semiconductor substrate, wherein said first structure comprises:
    a first gate dielectric portion abutting said semiconductor substrate;
    a first metal gate portion abutting said first gate dielectric portion;
    a dielectric material portion abutting said first metal gate portion; and
    an electrical fuse including a first polycrystalline semiconductor portion abutting said dielectric material portion and a first metal semiconductor alloy portion abutting said first polycrystalline semiconductor portion; and
    wherein said second structure comprises:
    a second gate dielectric portion abutting said semiconductor substrate;
    a second metal gate portion abutting said second gate dielectric portion;
    a second polycrystalline semiconductor portion abutting said second metal gate portion; and
    a second metal semiconductor alloy portion abutting said second polycrystalline semiconductor portion.

2. The semiconductor structure of claim 1, wherein said electrical fuse comprises:
    a first sub-portion of said first polycrystalline semiconductor portion;
    a second sub-portion of said first polycrystalline semiconductor portion; and
    a third sub-portion of said first polycrystalline semiconductor portion, wherein a widthwise edge of said first sub-portion abuts said second sub-portion and another widthwise edge of said first sub-portion abuts said third sub-portion, and wherein a first width of said first subpotion is less than a second width of said second sub-portion and is less than a third width of said third sub-portion.

3. The semiconductor structure of claim 1, wherein sidewalls of said first polycrystalline semiconductor portion are directly adjoined to, and are coincident with, sidewalls of said dielectric material portion.

4. The semiconductor structure of claim 1, wherein sidewalls of said first polycrystalline semiconductor portion are separated from sidewalls of said dielectric material portion by a top surface of said dielectric material portion.

5. The semiconductor structure of claim 1, further comprising a first dielectric spacer laterally abutting said first structure and a second dielectric spacer laterally abutting said second structure, wherein said first dielectric spacer and said second dielectric spacer have different heights.

6. The semiconductor structure of claim 1, further comprising:
    an upper dielectric spacer located directly on sidewalls of said first polycrystalline semiconductor portion; and
    a lower dielectric spacer located directly on sidewalls of said first metal gate portion, wherein said upper dielectric spacer and said lower dielectric spacer are disjoined from each other.

7. The semiconductor structure of claim 1, wherein said first gate dielectric portion and said second gate dielectric portion have a substantially same thickness, wherein said first metal gate portion and said second metal gate portion have another substantially same thickness, wherein said first polycrystalline semiconductor portion and said second polycrystalline semiconductor portion have yet another substantially same thickness, and wherein said first metal semiconductor alloy portion and said second metal semiconductor alloy portion have still another substantially same thickness.

8. The semiconductor structure of claim 1, wherein each of said first gate dielectric portion and said second gate dielectric portion comprises a high-k dielectric material selected from the group consisting of $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof.

9. The semiconductor structure of claim 1, wherein each of said first metal gate portion and said second metal gate portion comprises a metallic material selected from the group consisting of TaN, TiN, WN, TiAlN, TaCN, other conductive refractory metal nitrides, and an alloy thereof.

10. The semiconductor structure of claim 1, wherein said dielectric material portion comprises silicon oxide, silicon nitride, or silicon oxynitride.

11. The semiconductor structure of claim 1, wherein each of said first polycrystalline semiconductor portion and said second polycrystalline semiconductor portion comprises silicon, a silicon-carbon alloy, a silicon-germanium alloy, a silicon-carbon-germanium alloy, GaAs, InAs, InP, other III-V compound semiconductors, or II-VI compound semiconductors.

12. A method of forming a semiconductor structure comprising:
    forming a gate dielectric layer on a semiconductor substrate;
    forming a metal gate layer on said gate dielectric layer;
    forming a dielectric material portion in a first region, while said dielectric material portion is not present in a second region;
    forming a polycrystalline semiconductor layer on said metal gate layer and on said dielectric material portion;
    patterning a first structure containing a first portion of said polycrystalline semiconductor layer, at least a fraction of said dielectric material portion, a first portion of said metal gate layer, and a first portion of said gate dielectric layer; and
    patterning a second structure containing a second portion of said polycrystalline semiconductor layer, a second portion of said metal gate layer, and a second portion of said gate dielectric layer, and not containing any fraction of said dielectric material portion.

13. The method of claim 12, wherein said patterning of said first structure and said patterning of said second structure are performed concurrently employing a reactive ion etch and a patterned etch mask, and wherein said etch is selective to the gate dielectric layer and is not selective to the dielectric material portion.

14. The method of claim 12, wherein said patterning of said first structure and said patterning of said second structure are performed concurrently employing a reactive ion etch and a patterned etch mask, and wherein said etch is selective to the gate dielectric layer and the dielectric material portion.

15. The method of claim 12, further comprising
    forming an upper dielectric spacer directly on sidewalls of said first portion of said polycrystalline semiconductor layer; and
    forming a lower dielectric spacer directly on sidewalls of said first portion of said metal gate layer, wherein said upper dielectric spacer and said lower dielectric spacer are disjoined from each other.

16. The method of claim 12, further comprising:
    metallizing said first portion of said polycrystalline semiconductor layer to form a first metal semiconductor alloy portion; and
    metallizing said second portion of said polycrystalline semiconductor layer to form a second metal semiconductor alloy portion.

17. The method of claim 16, wherein said first structure includes an electrical fuse, and wherein said electrical fuse comprises:
    a first sub-portion of said first portion of said polycrystalline semiconductor layer;
    a second sub-portion of said first portion of said polycrystalline semiconductor layer; and
    a third sub-portion of said first portion of said polycrystalline semiconductor layer, wherein a widthwise edge of said first sub-portion abuts said second sub-portion and another widthwise edge of said first sub-portion abuts said third sub-portion, and wherein a first width of said first sub-potion is less than a second width of said second sub-portion and is less than a third width of said third sub-portion.

18. The method of claim 12, wherein said gate dielectric layer comprises a high-k dielectric material selected from the group consisting of $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof.

19. The method of claim 12, wherein said metal gate layer comprises a metallic material selected from the group consisting of TaN, TiN, WN, TiAlN, TaCN, other conductive refractory metal nitrides, and an alloy thereof 20. The method of claim 12, wherein said dielectric material portion comprises silicon oxide, silicon nitride, or silicon oxynitride.

* * * * *